US00RE47866E

(19) United States
(12) Reissued Patent
Tokiwa et al.

(10) Patent Number: US RE47,866 E
(45) Date of Reissued Patent: *Feb. 18, 2020

(54) THREE-DIMENSIONALLY STACKED NONVOLATILE SEMICONDUCTOR MEMORY

(71) Applicant: Toshiba Memory Corporation, Minato-ku (JP)

(72) Inventors: Naoya Tokiwa, Fujisawa (JP); Hideo Mukai, Tokyo (JP)

(73) Assignee: Toshiba Memory Corporation, Minato-ku (JP)

( * ) Notice: This patent is subject to a terminal disclaimer.

(21) Appl. No.: 15/015,189

(22) Filed: Feb. 4, 2016

Related U.S. Patent Documents

Reissue of:
(64) Patent No.: 8,228,733
Issued: Jul. 24, 2012
Appl. No.: 13/164,938
Filed: Jun. 21, 2011

U.S. Applications:
(63) Continuation of application No. 14/261,601, filed on Apr. 25, 2014, now Pat. No. Re. 45,929, which is an (Continued)

(30) Foreign Application Priority Data

Oct. 21, 2008 (JP) ..... 2008-271279

(51) Int. Cl.
*G11C 11/34* (2006.01)
*G11C 16/04* (2006.01)
(Continued)

(52) U.S. Cl.
CPC ..... *G11C 16/0483* (2013.01); *G11C 8/08* (2013.01); *G11C 16/08* (2013.01); *G11C 16/30* (2013.01);
(Continued)

(58) Field of Classification Search
CPC ..... G11C 16/0483; G11C 16/08; G11C 16/30; G11C 29/028; G11C 8/08;
(Continued)

(56) References Cited

U.S. PATENT DOCUMENTS 6,034,882 A * 3/2000 Johnson ..... G11C 11/5692 257/E27.073
6,166,957 A * 12/2000 Chung et al. ..... 365/185.23
(Continued)

FOREIGN PATENT DOCUMENTS

JP 2007-266143 10/2007

*Primary Examiner* — Ovidio Escalante
(74) *Attorney, Agent, or Firm* — Oblon, McClelland, Maier & Neustadt, L.L.P.

(57) ABSTRACT

A three-dimensionally stacked nonvolatile semiconductor memory of an aspect of the present invention including conductive layers stacked on a semiconductor substrate in such a manner as to be insulated from one another, a bit line which is disposed on the stacked conductive layers, a semiconductor column which extends through the stacked conductive layers, word lines for which the stacked conductive layers except for the uppermost and lowermost conductive layers are used and which have a plate-like planar shape, memory cells provided at intersections of the word lines and the semiconductor column, a register circuit which has information to supply a potential suitable for each of the word lines, and a potential control circuit which reads the information retained in the register circuit in accordance with an input address signal of a word line and which supplies a potential suitable for the word line corresponding to the address signal.

9 Claims, 19 Drawing Sheets

Related U.S. Application Data application for the reissue of Pat. No. 8,228,733, which is a continuation of application No. 12/553,266, filed on Sep. 3, 2009, now Pat. No. 7,983,084.

(51) Int. Cl.

| | |
|---|---|
| ***G11C 8/08*** | (2006.01) |
| ***G11C 16/08*** | (2006.01) |
| ***G11C 16/30*** | (2006.01) |
| ***G11C 29/02*** | (2006.01) |
| ***H01L 27/11578*** | (2017.01) |
| ***H01L 27/11582*** | (2017.01) |
| *G11C 29/12* | (2006.01) |

(52) U.S. Cl.

CPC ..... *G11C 29/028* (2013.01); *H01L 27/11578* (2013.01); *H01L 27/11582* (2013.01); *G11C 2029/1202* (2013.01)

(58) Field of Classification Search

CPC ..... G11C 2029/1202; H01L 27/11578; H01L 27/11582

USPC ..... 365/185.11

See application file for complete search history.

(56) References Cited

U.S. PATENT DOCUMENTS

| | | | | |
|---|---|---|---|---|
| 6,420,215 | B1 * | 7/2002 | Knall | H01L 21/822 257/E21.606 |
| 7,317,654 | B2 * | 1/2008 | Kim et al. | 365/230.06 |
| 7,679,133 | B2 | 3/2010 | Son et al. | |
| 7,821,058 | B2 | 10/2010 | Kidoh et al. | |
| 7,852,676 | B2 | 12/2010 | Maejima | |
| 7,936,004 | B2 | 5/2011 | Kito et al. | |
| 8,085,595 | B2 * | 12/2011 | Kim | G11C 16/30 365/185.02 |
| 2006/0133125 | A1 * | 6/2006 | So | G11C 5/063 365/63 |
| 2006/0221702 | A1 * | 10/2006 | Scheuerlein et al. | 365/185.23 |
| 2007/0147165 | A1 * | 6/2007 | Kato | 365/230.06 |
| 2007/0252201 | A1 * | 11/2007 | Kito et al. | H01L 21/8221 257/331 |
| 2007/0263453 | A1 * | 11/2007 | Tanzawa | G11C 7/04 365/185.23 |
| 2008/0067583 | A1 * | 3/2008 | Kidoh | H01L 21/8221 257/326 |
| 2009/0219750 | A1 | 9/2009 | Tokiwa et al. | |
| 2010/0012980 | A1 * | 1/2010 | Song | G11C 5/02 257/208 |

* cited by examiner

THREE-DIMENSIONALLY STACKED NONVOLATILE SEMICONDUCTOR MEMORY

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS-REFERENCE TO RELATED APPLICATIONS

*This application is a continuation of U.S. Reissue application Ser. No. 14/261,601 filed Apr. 25, 2014, which is continuation of U.S. application Ser. No. 13/164,938 filed Jun. 21, 2011 (now U.S. Pat. No. 8,228,733 issued Jul. 24, 2012), each of the foregoing applications is also an application for the reissue of U.S. Pat. No. 8,228,733, which corresponds to U.S. application Ser. No. 12/553,266 filed Sep. 3, 2009, thus the present application is a continuation reissue application.*

This application is a continuation of and claims the benefit of priority under 35 U.S.C. §120 from U.S. Ser. No. 12/553,266 filed Sep. 3, 2009, and claims the benefit of priority under 35 U.S.C. §119 from Japanese Patent Application No. 2008-271279 filed Oct. 21, 2008, the entire contents of each of which are incorporated herein by reference.

BACKGROUND OF THE INVENTION

1. Field of the Invention

The present invention relates to a three-dimensionally stacked nonvolatile semiconductor memory.

2. Description of the Related Art

A bit cost scalable (BiCS) technique is known as a technique for achieving higher capacity by a three-dimensional structure to reduce a bit cost (e.g., refer to Jpn. Pat. Appln. KOKAI Publication No. 2007-266143).

A nonvolatile semiconductor memory to which the BiCS technique is applied (hereinafter referred to as a BiCS memory) does not merely use a three-dimensional structure but also uses a device structure and a process technique that are elaborately designed. This enables bit cost scalability whereby the bit cost decreases in proportion to an increase in the number of stacked layers.

For example, in the case of a NAND-type flash memory to which the BiCS technique is applied (hereinafter referred to as a BiCS-NAND flash memory), the number of cells constituting a NAND array is longitudinally increased due to the increase in the number of stacked layers, thereby obtaining a memory capacity far above the limit of the memory capacity of a two-dimensionally structured NAND-type flash memory.

However, the BiCS memories including the BiCS-NAND flash memory have unique device structures. There are therefore many problems to solve in order to put such memories into practical use.

One of the problems lies in characteristic variations of the memory cells due to variations in shape.

In the BiCS memory, cell units constituting a memory cell array are formed on the side surfaces of a plurality of columnar active layers extending longitudinally to a semiconductor substrate. For example, after a plurality of conductive layers and insulating layers are alternately stacked, a hole extending through these layers is formed by, for example, a reactive ion etching (RIE) method. In this hole, charge storage layers and the columnar active layers are formed. The formed hole and the components formed in this hole are subject to an aspect ratio. This aspect ratio greatly depends on the number of stacked memory cells in the BiCS memory. That is, in the BiCS memory, due to an increase in the number of stacked layers, there may be a difference, between the upper side (bit line side) and the lower side (semiconductor substrate side) of the hole, in the diameter of the columnar active layers and in the thickness of a gate insulating film or the charge storage layer deposited on the side surface of the hole.

As a result, even in the case of the memory cells formed on the side surface of the same one active layer, there is a difference in electric properties including threshold voltages between the memory cells on the upper side of the active layer and the memory cells on lower side of the active layer.

BRIEF SUMMARY OF THE INVENTION

A three-dimensionally stacked nonvolatile semiconductor memory of an aspect of the present invention comprising: a memory cell array provided in a semiconductor substrate; four or more conductive layers stacked on the semiconductor substrate in the memory cell array in such a manner as to be insulated from one another; a bit line which is disposed on the four or more conductive layers in such a manner as to be insulated from the conductive layers and which has a straight planar shape extending in a first direction; a semiconductor column which extends through the four or more conductive layers and which has an upper end connected to the bit line and a lower end connected to the semiconductor substrate; two or more word lines for which the conductive layers among the four or more conductive layers except for the uppermost and lowermost conductive layers are used and which have a plate-like planar shape; memory cells provided at intersections of the two or more word lines and the semiconductor column, respectively; a register circuit which retains operation setting information for the memory cell array and which has information to supply a potential suitable for each of the word lines; and a potential control circuit which controls the potentials supplied to the word lines and which reads the information retained in the register circuit in accordance with an input address signal of a word line and which supplies a potential suitable for the word line corresponding to the address signal.

A three-dimensionally stacked nonvolatile semiconductor memory of an aspect of the present invention comprising: a memory cell array provided in a semiconductor substrate; three or more first conductive layers stacked on the semiconductor substrate in the memory cell array in such a manner as to be insulated from one another; three or more second conductive layers which are adjacent to the first conductive layers in a first direction and which are stacked on the semiconductor substrate in the memory cell array in such a manner as to be insulated from one another; a straight bit line which is disposed on the first and second conductive layers in such a manner as to be insulated from the first and second conductive layers and which extends in the first direction; a straight source line which is provided between the bit line and the uppermost second conductive layer and which extends in a second direction intersecting with the first direction; a first semiconductor column which extends through the plurality of first conductive layers and which has an upper end connected to the bit line; a second semiconductor column which extends through the plurality of second conductive layers and which has an upper end connected to the source line and a lower end connected to the first semiconductor column; two or more first straight word lines for which the conductive layers among the three or more first conductive layers except for the uppermost conductive layer are used and which extend in the second direction; two or more second straight word lines for which the conductive layers among the three or more second conductive layers except for the uppermost conductive layer are used and which extend in the second direction; memory cells provided at intersections of the two or more first word lines and the first semiconductor column and at intersections of the two or more second word lines and the second semiconductor column, respectively; a register circuit which retains operation setting information for the memory cell array and which has information to supply a potential suitable for each of the first and second word lines; and a potential control circuit which controls the potentials supplied to the first and second word lines and which reads the information retained in the register circuit in accordance with an input address signal of a word line and which supplies a potential suitable for the word line corresponding to the address signal.

DETAILED DESCRIPTION OF THE INVENTION

An embodiment of the present invention will hereinafter be described in detail with reference to the drawings.

1. Embodiment (1) BiCS Memory

First, the basic configuration of a BiCS memory is described as an example of a three-dimensionally stacked nonvolatile semiconductor memory according to the embodiment of the present invention.

Figure 1:
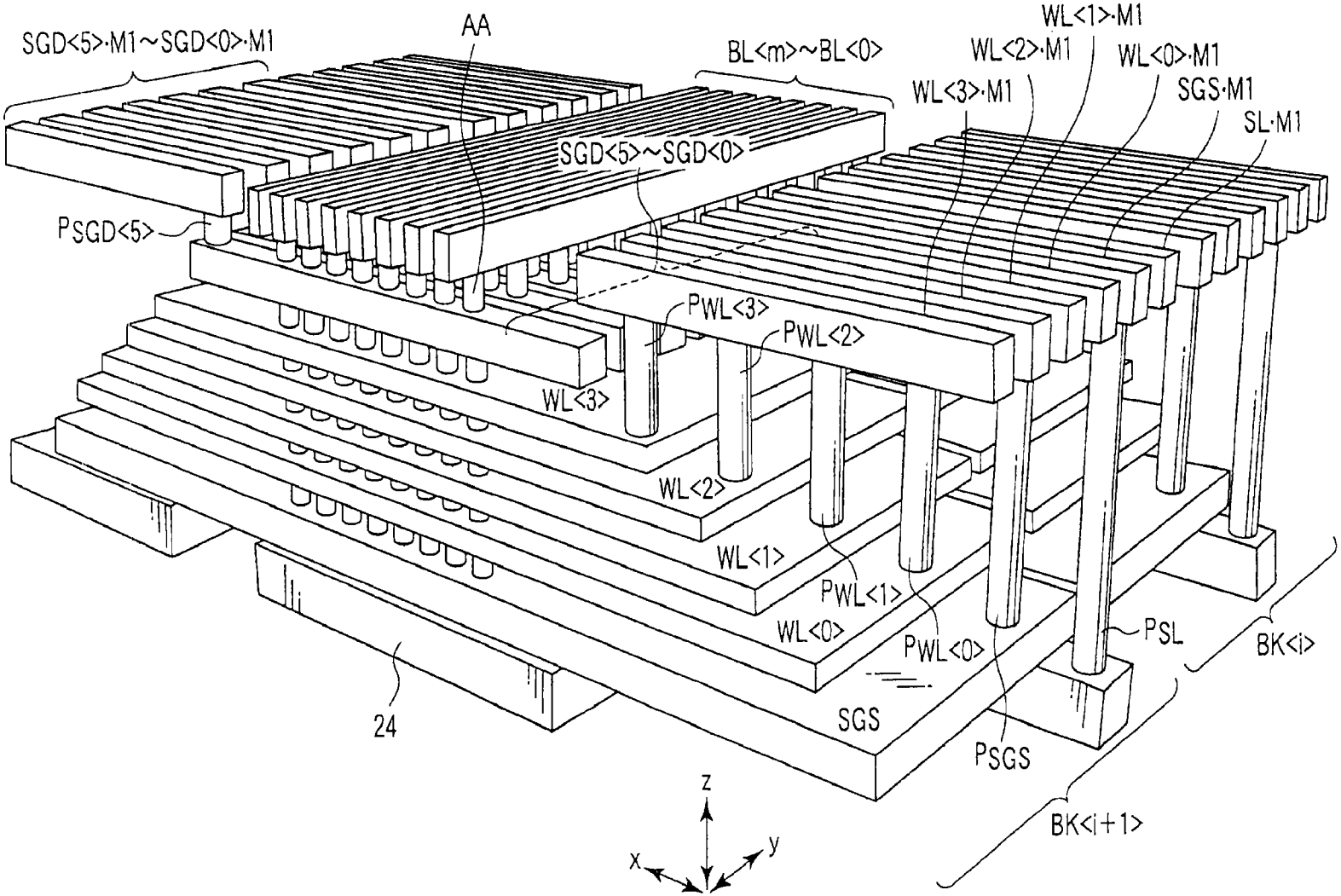
FIG. 1 is a bird's-eye view of a BiCS memory.

FIG. 1 shows a bird's-eye view of the BiCS-NAND flash memory.

The BiCS-NAND flash memory is composed of, for example, a plurality of blocks each serving as one unit for erasure. Here, two blocks BK<i>, BK<i+1> are shown.

For example, one common source diffusion layer 24 formed in a semiconductor substrate is provided for all the blocks. The source diffusion layer 24 is connected to a source line SL•M1 via a contact plug $P_{SL}$. Further, three or more conductive layers made of, for example, conductive polysilicon are stacked on the source diffusion layer 24 (in this example, a six-layer structure).

Except for the uppermost layer, the remaining five conductive layers are plate-shaped in one block BK<i+1>. The ends of the five conductive layers except for the uppermost layer in the x-direction are stepped to allow contact with each of these layers. The lowermost layer serves as a source line side select gate line (second select gate line) SGS, and the remaining four conductive layers except for the lowermost and uppermost layers serve as word lines WL<0>, WL<1>, WL<2>, WL<3>.

The uppermost layer is composed of a plurality of linear (straight) conductive interconnections extending in the x-direction (a second direction). For example, six conductive interconnections are arranged in one block BK<i+1>. For example, six conductive interconnections in the uppermost layer serve as bit line side select gate lines (first select gate lines) SGD<0> to SGD<5>.

Furthermore, a plurality of active layers (active areas) AA for constituting a NAND cell unit (memory cell unit) are formed to be columnar in the z-direction (a direction perpendicular to the surface of the semiconductor substrate) so that these active layers reach the source diffusion layer 24 through the plurality of conductive layers.

The upper ends of the plurality of columnar active layers (semiconductor columns) AA are connected to a plurality of bit lines BL<0> to BL<m> extending in the y-direction (a first direction). Moreover, the source line side select gate line SGS is connected, via a contact plug $P_{SGS}$, to a lead-out line SGS•M1 extending in the x-direction. The word lines WL<0> to WL<3> are connected, via contact plugs $P_{WL<0>}$ to $P_{WL<3>}$, lead-out lines WL<0>•M1 to WL<3>•M1 extending in the x-direction, respectively.

Furthermore, the bit line side select gate lines SGD<0> to SGD<5> are connected, via contact plugs $P_{SGD<0>}$ to $P_{SGD<5>}$, lead-out lines SGD<0>•M1 to SGD<5>•M1 extending in the x-direction, respectively.

The plurality of bit lines BL<0> to BL<m> and the lead-out lines SGS•M1, WL<0>•M1, WL<1>•M1 to WL<3>•M1, SGD<0>•M1 to SGD<5>•M1, SL•M1 are formed of, for example, a metal.

Figure 2:
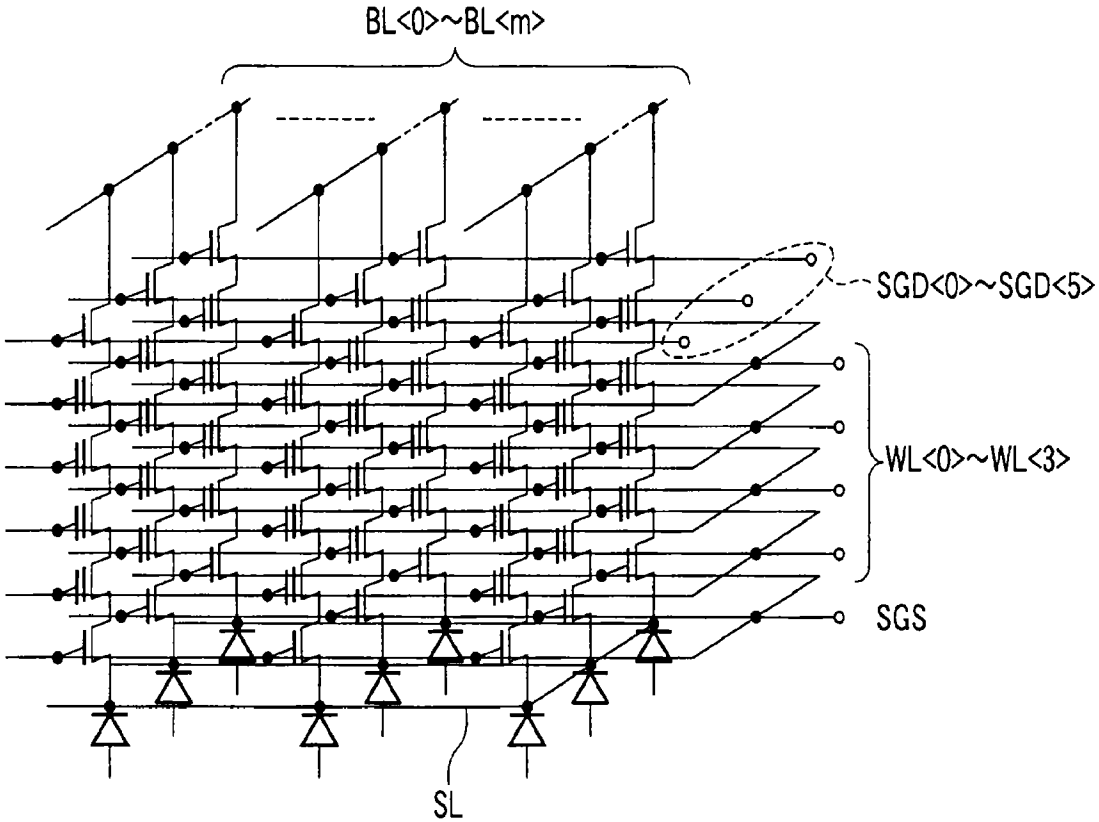
FIG. 2 is an equivalent circuit diagram of a memory cell array.

FIG. 2 shows an equivalent circuit diagram of a memory cell array. The BiCS-NAND flash memory has a three-dimensional structure. Accordingly, an equivalent circuit is three-dimensionally illustrated.

A greater number of memory cells constituting a NAND string can make a greater contribution to higher capacity. However, due to the characteristics of the BiCS structure, the characteristics of the memory cells may vary in a manufacturing process along with an increase in the number of memory cells constituting the NAND string.

Figure 3:
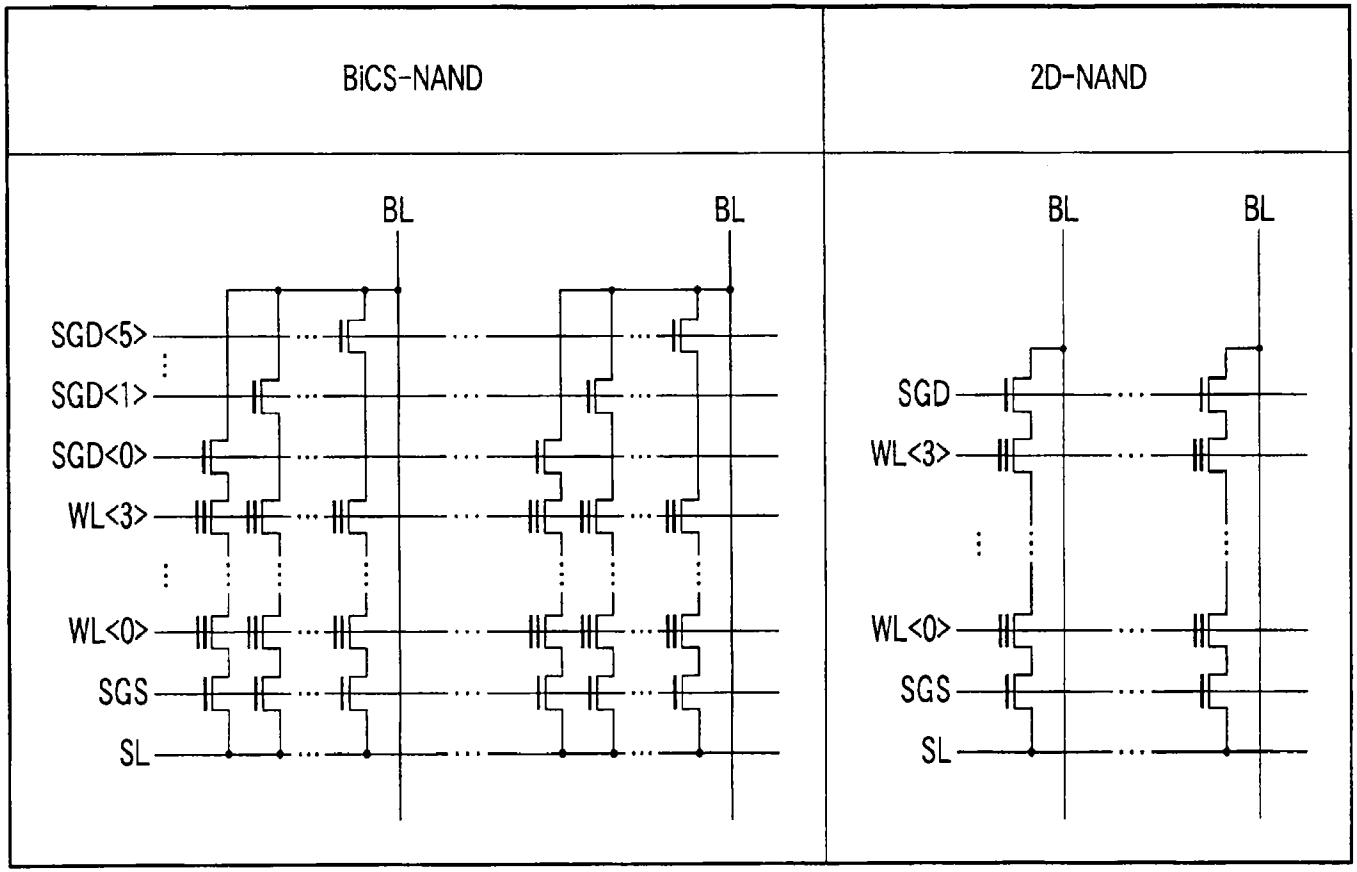
FIG. 3 is a diagram for comparison between a BiCS NAND and a two-dimensional NAND.

FIG. 3 is a diagram showing the BiCS-NAND flash memory and a two-dimensional NAND flash memory in comparison with each other.

In the two-dimensionally structured NAND type flash memory (referred to as a two-dimensional NAND), one NAND cell unit in one block is connected to one bit line BL. In contrast, in the BiCS-NAND, a plurality of NAND cell units in one block are connected to one bit line BL.

Thus, in writing or reading operation, one of the plurality of cell units in one block connected to one bit line BL is selected by the bit line side select gate lines SGD<0> to SGD<5>.

Figure 4:
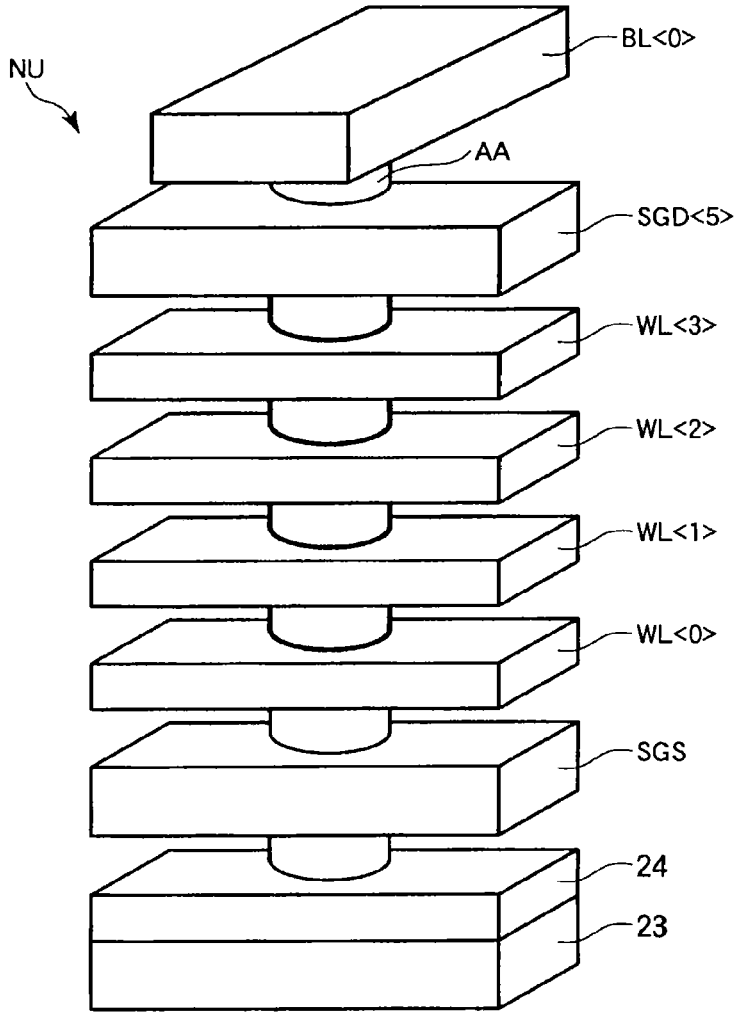
FIG. 4 is a bird's-eye view of a NAND cell unit.

FIG. 4 shows a bird's-eye view of the NAND cell unit.

One characteristic of the three-dimensionally structured NAND cell unit is that the source line side select gate line SGS, the word lines WL<0> to WL<3> and the bit line side select gate lines SGD<0> to SGD<5> are structured to enclose the side surface of the columnar active layer AA.

Therefore, even if, for example, the plurality of active layers AA are thinned to form more active layers AA on a semiconductor substrate 23 for higher capacity, a sufficient driving force can be ensured for transistors constituting the NAND cell unit.

Figure 5:
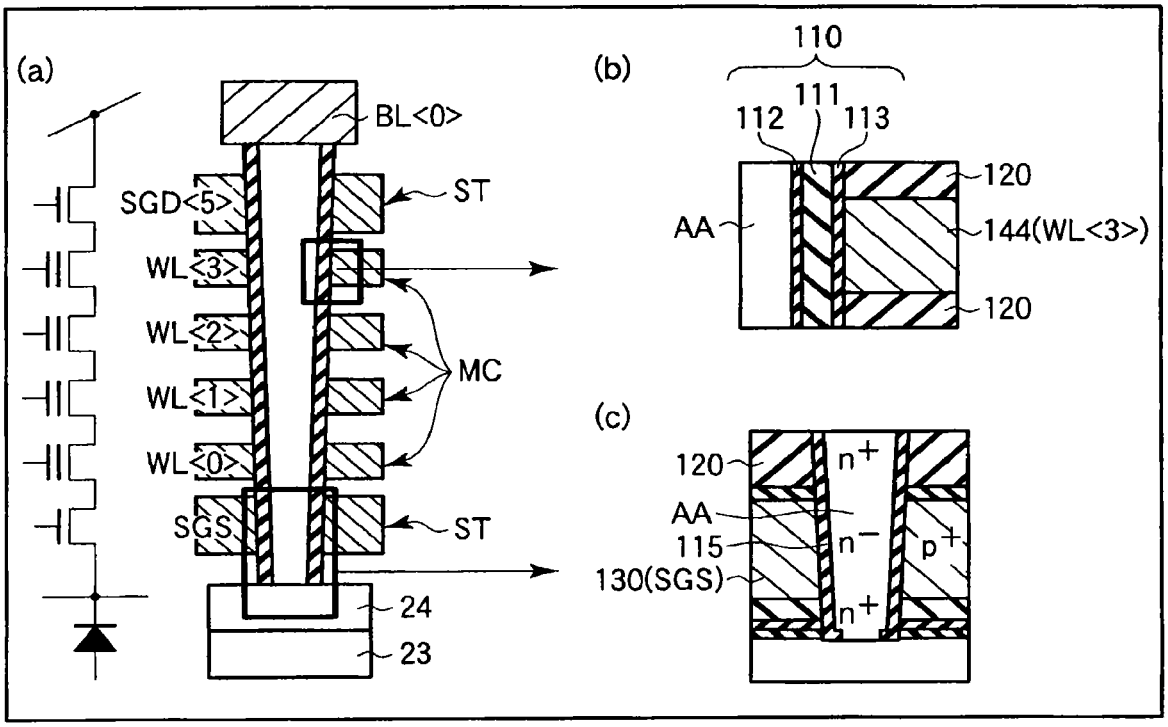
FIG. 5 is a sectional view showing the structure of the NAND cell unit.

FIG. 5 shows an example of the structure of a NAND cell unit NU of the BiCS-NAND flash memory. A plurality of memory cells MC and select transistors ST constituting one NAND cell unit are stacked in the z-direction via an inter-layer insulating film 120.

The memory cell MC has a MONOS structure. The MONOS structure means a gate structure including an insulator such as nitride as a charge storage layer. That is, as shown in FIG. 5, the memory cell MC includes, for example, an oxide-nitride-oxide (ONO) film 110 having a structure in which a charge storage layer 111 is held between two insulating films (oxide) 112, 113. The insulating film 112 intervenes between the charge storage layer 111 and the active layer AA. The insulating film 112 functions as a tunnel insulating film during writing of data. The insulating film 112 also functions as a block insulating film for preventing the leakage of a charge into the active area AA during retention of data. The insulating film 113 intervenes between the charge storage layer 111 and a gate electrode 144. The insulating film 113 functions as a block insulating film for preventing the leakage of a charge trapped by the charge storage layer 111 into a gate electrode 144. The gate electrode 144 functions as the word line WL<3>. In addition, the memory cell MC may be a memory cell of a MNOS structure which is not provided with the block insulating film 113.

The select transistor ST has, for example, the same structure as that of the memory cell MC. However, a gate insulating film 115 of the select transistor ST intervening between the active layer AA and the source line side select gate line SGS (a gate electrode 130) may have a structure different from that of the memory cell MC, that is, may have a structure with no charge storage layer (e.g., a single silicon oxide film).

Figure 6:
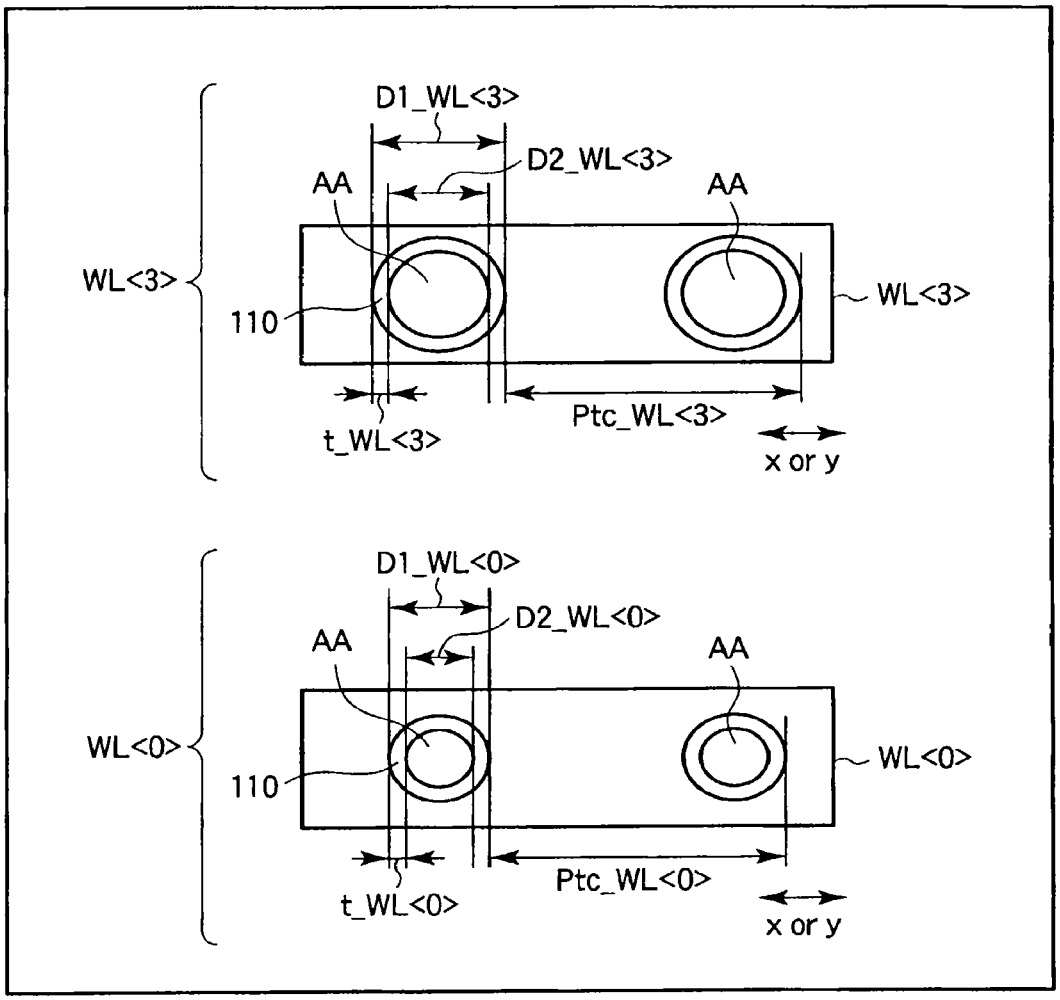
FIG. 6 is a plan view showing the structure of the NAND cell unit.

As described above, the columnar active layers AA are formed in the hole extending through the plurality of stacked conductive layers and insulating layers. Therefore, when the hole is formed by the reactive ion etching (RIE) method, the sectional shape of the hole tends to be tapered if the aspect ratio of the hole is high. As a result, the active layers AA embedded in this hole are also tapered. FIG. 6 shows the planar structures of the lower side (semiconductor substrate side) first word line WL<0> and the upper side (bit line side) fourth word line WL<3>. The planar structures of the word lines WL<0>, WL<3> schematically shown in FIG. 6 correspond to sections (x-y planes) parallel with the surface of the semiconductor substrate.

As described above, the active layers AA tend to be tapered, so that there may be a dimensional difference in shape between the memory cell provided on the upper side (the word line WL<3>) and the memory cell provided on the lower side (the word line WL<0>). For example, a hole diameter D1_WL<3> at the position where the fourth word line WL<3> is formed tends to be equal to or more than a hole diameter D1_WL<0> at the position where the first word line WL<0> is formed. A pillar diameter D2_WL<3> of the active layer AA at the position where the fourth word line WL<3> is formed also tends to be equal to or more than a pillar diameter D2_WL<0> of the active layer AA at the position where the first word line is formed.

The insulating film (ONO film) 110 formed along the side surface of the hole is more difficult to deposit on the lower side surface of the hole than on the upper side surface of the hole. Thus, a thickness t_WL<3> of the insulating film at the position where the fourth word line WL<3> is formed may be equal to or more than a thickness t_WL<0> of the insulating film at the position where the first word line WL<0> is formed.

The plurality of active layers AA are laid out in the x-direction or y-direction at predetermined intervals (pitch Ptc_WL<3>, Ptc_WL<0>). However, if the active layers AA are tapered, an interval (Ptc_WL<3>-D1_WL<3>) between adjacent active layers at the position where the fourth word line WL<3> is formed may also be different from an interval (Ptc_WL<0>-D1_WL<0>) between adjacent active layers at the position where the first word line WL<0> is formed. Specifically, the pillar diameter D2_WL<0> and the thickness t_WL<0> at the position where the first word line WL<0> is formed tend to be smaller than the pillar diameter D2_WL<3> and the thickness t_WL<3> at the position where the fourth word line WL<3> is formed, so that the interval (Ptc_WL<0>-D1_WL<0>) between the active layers at the position where the first word line WL<0> is formed tends to be greater than the interval (Ptc_WL<3>-D1_WL<3>) between the active layers at the position where the fourth word line WL<3> is formed.

Furthermore, even the memory cells connected to the same word line are not necessarily uniform in the size of the active areas (holes) adjacently formed in the x-direction or y-direction or in the thickness of the ONO film 110.

(2) Overall Configuration

Figure 7:
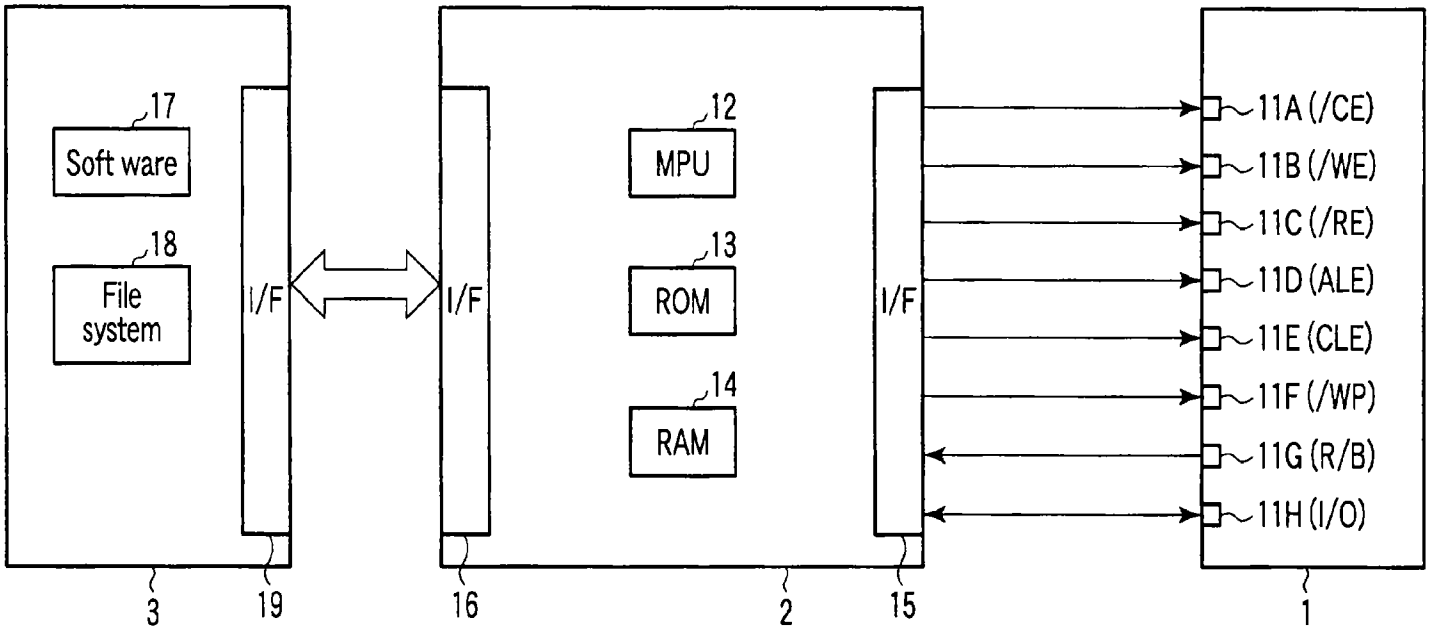
FIG. 7 is a block diagram showing the overall configuration of a memory system using the BiCS memory.

FIG. 7 schematically shows a memory chip 1 using the BiCS memory (hereinafter referred to as a BiCS memory chip 1), and a controller 2 and a host 3 which control the BiCS memory chip 1.

The BiCS memory chip 1 has control pins 11A to 11G and an I/O pin 11H. The input/output of data between the memory chip 1 and the controller 2 and the control the operation of the memory chip 1 are performed by the pins 11A to 11G.

A device selection signal (/CE) is input to the control pin 11A. A write enable signal (/WE) for bringing the I/O pin 11H into an input state is input to the control pin 11B. A read enable signal (/RE) for outputting data from the I/O pin 11H is input to the control pin 11C. An address latch enable signal (ALE) is input to the control pin 11D. The address latch enable signal is a signal for determining whether a signal provided to the I/O pin 11H is data or an address. A command latch enable signal (CLE) is input to the control pin 11E. The command latch enable signal (CLE) is a signal for writing an operation command provided to the I/O pin 11H into a command decoder. A write protect signal (/WP) for prohibiting writing or erasing operation is input to the control pin 11F. A ready/busy signal (R/B) for allowing the internal operation state of the memory chip 1 to be externally recognized is output to the control pin 11G. The I/O pin 11H is in charge of data input/output. Although one I/O pin is shown in FIG. 7, it should be understood that a plurality of I/O pins 11H may be provided on the chip. In addition, other pins may be provided without limiting to the control pins and the I/O pin.

The controller 2 is connected to the memory chip 1 via an interface 15.

The interface 15 includes pins corresponding to the control pins 11A to 11G and the I/O pin 11H of the BiCS memory chip 1, and sets an agreement for enabling communication with the memory chip 1. In addition, the interface 15 may not only have hardware such as control pins but also software for interfacing with the memory chip 1.

The controller 2 has an MPU 12, a ROM 13 and a RAM 14. The MPU 12 controls the operations of the memory chip 1 and the controller 2. The MPU 12 reads firmware (control program) stored in the ROM 13 or setting information for the memory chip 1 onto RAM 14 in order to execute predetermined processing.

Moreover, data input/output is performed between the controller 2 and the external device 3 such as the host via interfaces 16, 19.

The host 3 includes hardware and software for accessing the controller 2. The host 3 includes software 17 such as an application and an operating system. The software 17 instructs a file system 18 to input/output data in accordance with an instruction from a user to input/output data to/from the memory chip 1. The file system 18 is a system for managing files (data) recorded in a recording medium to be managed. The file system 18 records management information into a storage area of the memory chip 1, and uses the management information to manage the files.

Figure 8:
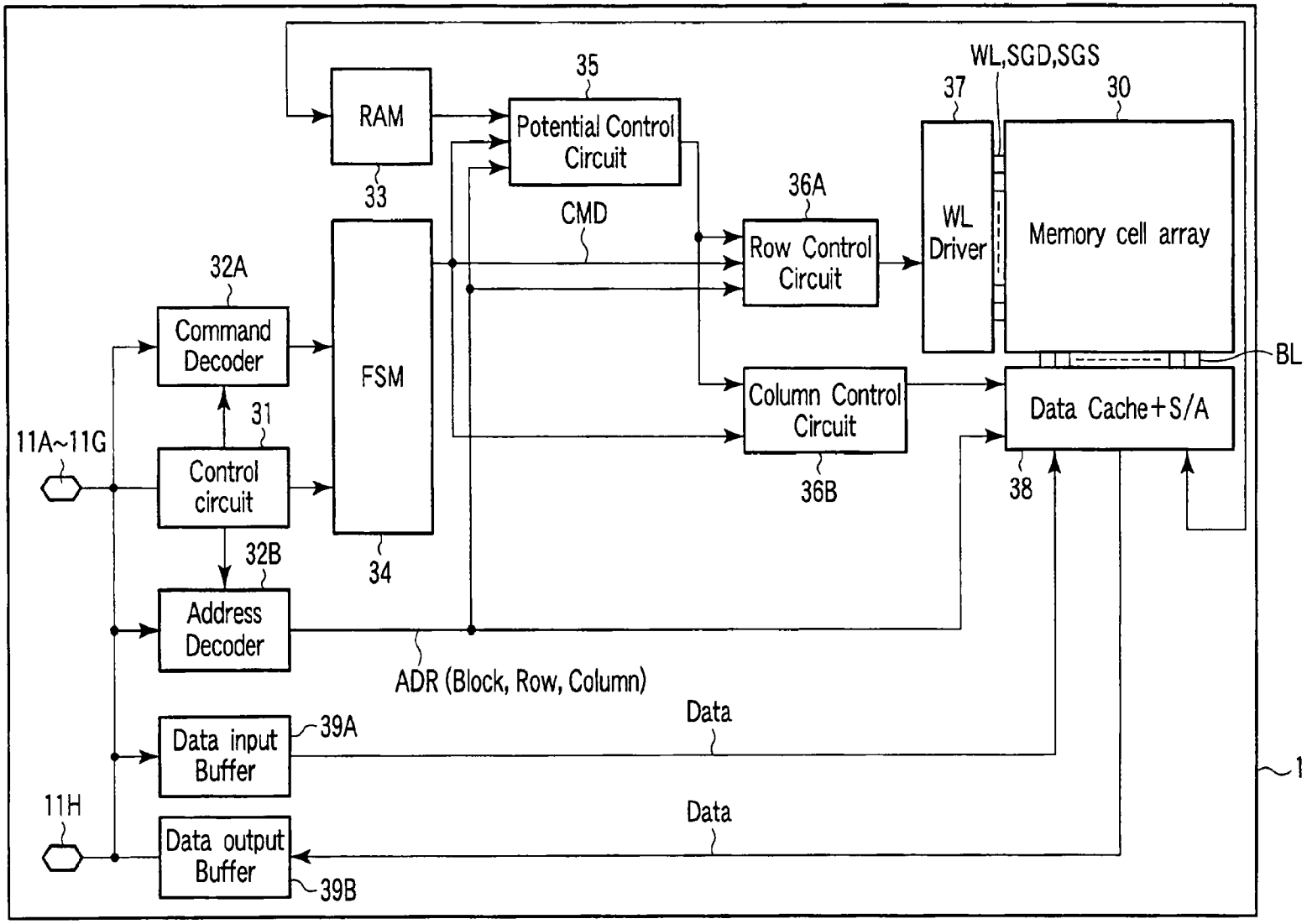
FIG. 8 is a block diagram showing the inside of a BiCS memory chip.

FIG. 8 is a block diagram showing the circuit configuration of the BiCS memory chip 1 using the BiCS memory.

A memory cell array 30 is composed of the BiCS-NAND flash memories described with FIGS. 1 to 6. Data is stored in a nonvolatile manner in each of the memory cells constituting the memory cell array 30.

Write data is input to the memory chip 1 from the outside of the chip 1 via the I/O pin 11H. A data input buffer 39A temporarily retains the write data. A data output buffer 39B temporarily retains data read from the memory cell array 30.

A control circuit 31 recognizes the states (e.g., high(H)/low(L)) of the control pins 11A to 11G, and controls the operations of the internal circuits in the memory chip 1.

A command decoder 32A decodes an instruction provided from the outside of the chip via the control pins 11A to 11G and the I/O pin 11H.

An address decoder 32B decodes the addresses of, for example, write, read or erasure target word lines or memory cells provided from the outside of the chip via the control pins 11A to 11G and the I/O pin 11H. The address decoder 32B temporarily retains these addresses.

A register circuit (e.g., a RAM) 33 retains the setting information for the memory chip 1 read from a storage area in the memory cell array 30 or setting information provided from the outside of the memory chip 1. The register circuit 33 in the present embodiment retains, as one kind of setting information, values corresponding to a write potential suitable for each of the plurality of word lines WL and a word line supply potential such as a nonselection potential.

A state machine 34 controls the operation of the whole memory chip 1 including reading, writing and erasing in the memory cells, in accordance with outputs from the control circuit 31 and the command decoder 32A.

The operation of a potential control circuit 35 is controlled by the state machine 34. The potential control circuit 35 generates potentials to be supplied to a selected word line and nonselected word lines, in accordance with an address signal ADR input from the address decoder 32B. The potential control circuit 35 generates a supply potential in accordance with a value which indicates a supply potential suitable for each of the plurality of word lines and which is retained in the register circuit 33.

A row control circuit 36A selects one of the plurality of word lines WL in accordance with a command signal CMD input from the state machine 34 and the address signal ADR input from the address decoder 32B.

A word line driver 37 controls the potential of the word line WL, including the transfer of a potential to the word line WL and the discharge of a potential of the word line WL. The potential generated by the potential control circuit 35 is input to the word line driver 37 via the row control circuit 36A. The word line driver 37 then transfers the input potential to the memory cells connected to the word lines WL. In addition, the word line driver 37 controls the potentials of the select gate lines SGD, SGS as well as the potentials of the word lines WL, and also controls the turning on/off of the select transistor.

A column control circuit 36B receives outputs from the potential control circuit 35 and the state machine 34, and then controls the operation of a data cache/sense amplifier 38.

The data cache/sense amplifier 38 is controlled by the column control circuit 36B in accordance with the address signal ADR. Moreover, the data cache/sense amplifier 38 temporarily retains data to be written into the memory cells and data read from the memory cells. The data cache/sense amplifier 38 transfers a potential corresponding to the data to the bit line, or senses the potential of the bit line corresponding to the data. The data cache/sense amplifier 38 also temporarily retains data during the verification of a write.

The data to be written into the memory cells is input to the data cache/sense amplifier 38 from the data input buffer 39A. The data read from the memory cells is output to the data output buffer 39B from the data cache/sense amplifier 38.

The potentials supplied to the word lines WL, the bit lines BL and the select gate lines SGS, SGD in the memory cell array 30 are controlled by the configuration described above, such that data is written into a selected memory cell or data is read from a selected memory cell. In the writing operation and reading operation in the memory cell array 30, the potentials of the word lines WL and the select gate lines SGD, SGS are controlled, for example, as shown in FIGS. 9 and 10.

Figure 9:
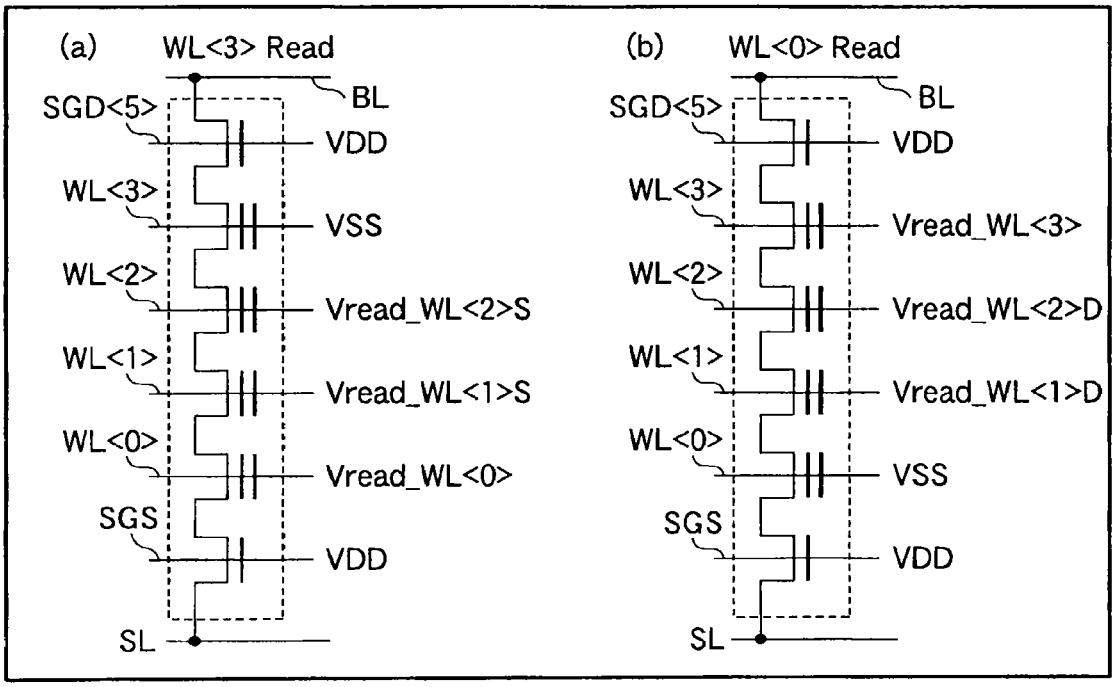
FIG. 9 is a diagram for explaining reading of data in the BiCS memory.
Figure 10:
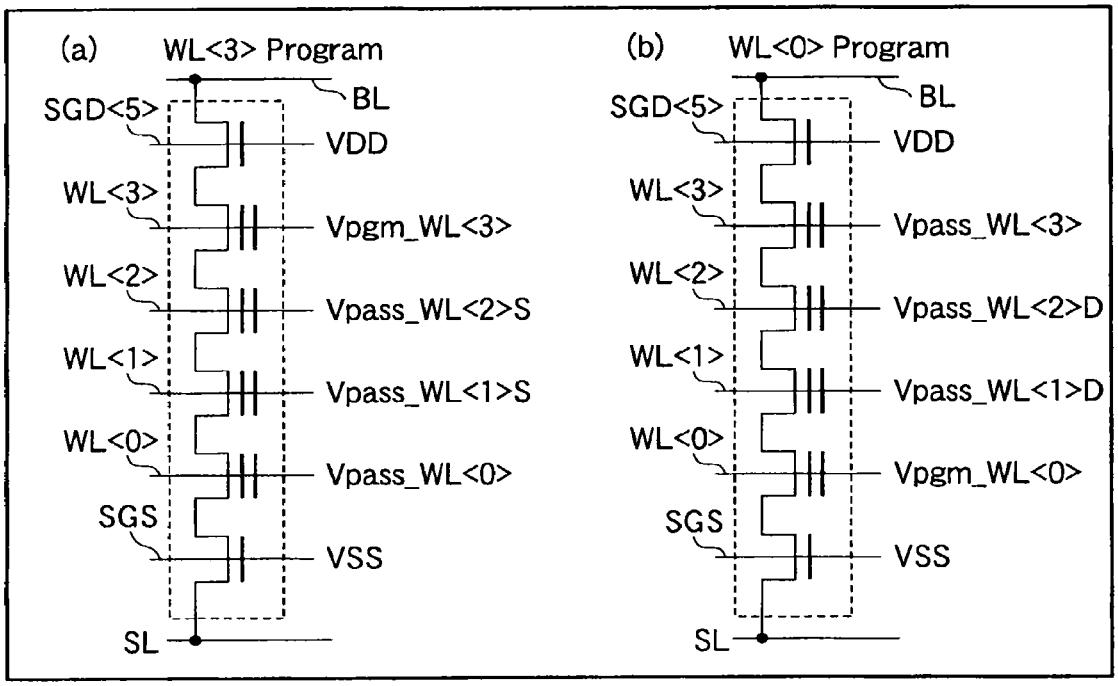
FIG. 10 is a diagram for explaining writing of data in the BiCS memory.

FIG. 9 shows one example of set potentials for the word lines and the select gate lines in the NAND cell unit to which a selected memory cell (hereinafter referred to as a selected cell) belongs during reading of data.

In FIG. 9, there are shown set potentials for the word lines WL<0> to WL<3> and the select gate lines SGD<5>, SGS for reading of data from the memory cell connected to the fourth word line WL<3> and for reading of data from the memory cell connected to the first word line WL<0>.

During the reading operation, a potential VDD (e.g., a power supply potential) is applied to the select gate lines SGD<5>, SGS. Thus, the select transistors connected to the bit line side and source line side select gate lines SGD<5>, SGS are turned on.

A read selection potential VSS (e.g., a ground potential) is applied to the word line WL<3> (or the word line WL<0>) selected as a read target.

For example, read nonselection potentials Vread_WL<1>S, Vread_WL<1>D, Vread_WL<2>S, Vread_WL<2>D are applied to the word lines which are not selected as read targets such as the word lines WL<1>, WL<2>. This prevents erroneous reading from nonselected cells during the reading operation.

FIG. 10 shows one example of set potentials for the word lines and the select gate lines in the NAND cell unit to which a selected cell belongs during writing of data.

In FIG. 10, there are shown set potentials for the word lines WL<0> to WL<3> and the select gate lines SGD<5>, SGS for writing of data into the memory cell connected to the fourth word line WL<3> and for writing of data into the memory cell connected to the first word line WL<0>.

During the writing operation, for example, the potential VDD is applied to the bit line side select gate line SGD<5>, while the ground potential VSS is applied to the source line side select gate line SGS.

Write potentials Vpgm_WL<3>, Vpgm_WL<0> are applied to the word lines WL<3>, WL<0> selected as write targets.

On the other hand, write nonselection potentials Vpass_WL<1>S, Vpass_WL<1>D, Vpass_WL<2>S, Vpass_WL<2>D are applied to the word lines (memory cells) which are not selected as write targets such as the word lines WL<1>, WL<2>. Channels of the nonselected cells are boosted up by the nonwrite potentials Vpass_WL<1>S, Vpass_WL<1>D, Vpass_WL<2>S, Vpass_WL<2>D such that erroneous writing is prevented.

As described with FIG. 6, variations in the parameters of physical shapes such as the sizes (pillar diameters) of the active layers AA and the thickness of the ONO film 110 cause variations in the potential application time necessary for reading from the respective memory cells even if the same read potential is supplied to the word lines WL<0> to WL<3> during reading of data. Moreover, the variations in the parameters of physical shapes may result in variations in the speed of writing into the respective memory cells even if the same write potential is supplied to the word lines WL<0> to WL<3> during writing of data.

Furthermore, in the memory cells for each word line, a difference of writing or reading reliability may be made between the selected/nonselected cells. For example, in the tapered active layers AA, there is a difference of pillar diameter between the bit line side (upper side) and the source line side (lower side). Therefore, even the memory cells formed on the same active layer AA have variations in on-resistance and are different in read current. If the charge storage layer 111, the gate insulating film 112 and the block insulating film 113 constituting the ONO film 110 are different in thickness, the write potential is different for each memory cell. The nonselection potentials for preventing erroneous writing/reading also vary.

In the three-dimensionally stacked nonvolatile semiconductor memory (BiCS memory) according to the embodiment of the present invention, the register circuit 33 retains, as one kind of setting information, information for generating supply potentials which are adjusted in intensity for the respective word lines so that write potentials or nonselection potentials suitable for the plurality of word lines WL<0> to WL<3> may be supplied. Further, the potential control circuit 35 reads the setting information for the supply potentials retained in the register circuit 33 in accordance with an input address signal, and supplies the word lines WL<0> to WL<3> with the potentials suitable therefor.

This compensates for the characteristic variations of the memory cells in the three-dimensionally stacked nonvolatile semiconductor memory in the present embodiment.

For example, in the example shown in FIG. 9, for reading data from the memory cell connected to the fourth word line WL<3>, the register circuit 33 retains, as the setting information for the supply potentials suitable for the respective word lines, information for generating read nonselection potentials Vread_WL<0>S, Vread_WL<1>S, Vread_WL<2>S which are adjusted in consideration of the manufacturing variations (size variations) of the memory cells.

The potential control circuit 35 reads the setting information in the register circuit 33 in accordance with the address signal ADR, generates potentials based on this information, and supplies the word lines WL<0> to WL<2> which are not selected for reading with the potentials suitable therefor.

Similarly, when data is read from the memory cell connected to the first word line WL<0>, nonselection potentials Vread_WL<1>D, Vread_WL<2>D, Vread_WL<3>D suitable for the nonselected word lines WL<1> to WL<3> are generated in accordance with an address signal and the setting information in the register circuit 33, and the generated potentials are supplied to the word lines WL<1> to WL<3>.

Moreover, the nonselected word lines WL<0>, WL<3> during reading shown in FIG. 9 are not necessarily provided with the same potential, and may be provided with potentials suitable therefor in accordance with the setting information retained in the register circuit 33.

For the writing operation, the register circuit 33 retains, as the setting information, information for the word line supply potentials adjusted to be suitable for the word lines WL<0> to WL<3>, as in the case of the reading operation. Then, the potential control circuit 35 generates potentials based on this setting information, and supplies the generated potentials to the word lines WL<0> to WL<3>.

For example, in the example shown in FIG. 10, the potential control circuit 35 generates, in accordance with the setting information retained in the register circuit 33, the write potential Vpgm_WL<3> suitable when the fourth word line WL<3> is selected and the write potential Vpgm_WL<0> suitable when the first word line WL<0> is selected. The potential control circuit 35 then supplies the potentials to the word lines WL<3>, WL<0>.

On the other hand, when the fourth word line WL<3> is selected, write nonselection potentials Vpass_WL<0>S, Vpass_WL<1>S, Vpass_WL<2>S generated in accordance with the setting information in the register circuit 33 are provided to the nonselected word lines WL<0>, WL<1>, WL<2> as nonselection potentials suitable therefor. Similarly, when the first word line WL<0> is selected, write non-selection potentials Vpass_WL<1>D, Vpass_WL<2>D, Vpass_WL<3>D are also generated in accordance with the setting information and provided to the nonselected word lines WL<1>, WL<2>, WL<3> as non-selection potentials suitable therefor.

In addition, the BiCS memory in the embodiment of the present invention supplies the plurality of word lines with the potentials suitable therefor in accordance with the setting information during the writing or reading operation. Thus, during the writing operation, a potential suitable for the writing of data has only to be supplied to the selected word line, so that the write potential Vpgm_WL<0> for the first word line WL<0> may be the same as or different from the write potential Vpgm_WL<3> for the fourth word line WL<3>. Similarly, the read nonselection potentials Vread_WL<2>D, Vread_WL<1>D when the first word line WL<0> is selected may be the same as or different due to interference between adjacent cells from the read nonselection potentials Vread_WL<2>S, Vread_WL<1>S when the fourth word line WL<3> is selected.

Furthermore, even in the case of the write nonselection potentials for the same word line WL<1>, the write nonselection potential Vpass_WL<1>S when the fourth word line WL<3> is selected may be the same as or different due to interference between adjacent cells from the nonselection potential Vpass_WL<1>D when the first word line WL<0> is selected.

Thus, according to the three-dimensionally stacked non-volatile semiconductor memory in the embodiment of the present invention, potentials suitable for the plurality of word lines are generated in accordance with the address signal and the setting information, and the generated potentials are supplied to the word lines. Consequently, in the memory cell array in which the memory cells are three-dimensionally arranged, even when the shapes of the active layers AA and the thickness of the ONO film 110 are different due to the structure and manufacturing process of the memory cell array, it is possible to compensate for variations in electric properties of the memory cells due to the three-dimensional structure, such as variations in writing speed or bias application time and variations in writing reliability.

(3) Generation and Adjustment of Word Line Supply Potentials

With reference to FIGS. 11 to 17, a circuit configuration and a method are described below wherein the potentials to be supplied to the word lines are adjusted to potentials suitable therefor, and the suitable potentials are supplied to the word lines. Write potentials are mainly described below by way of example.

(3.1) First Adjustment Example

Figure 11:
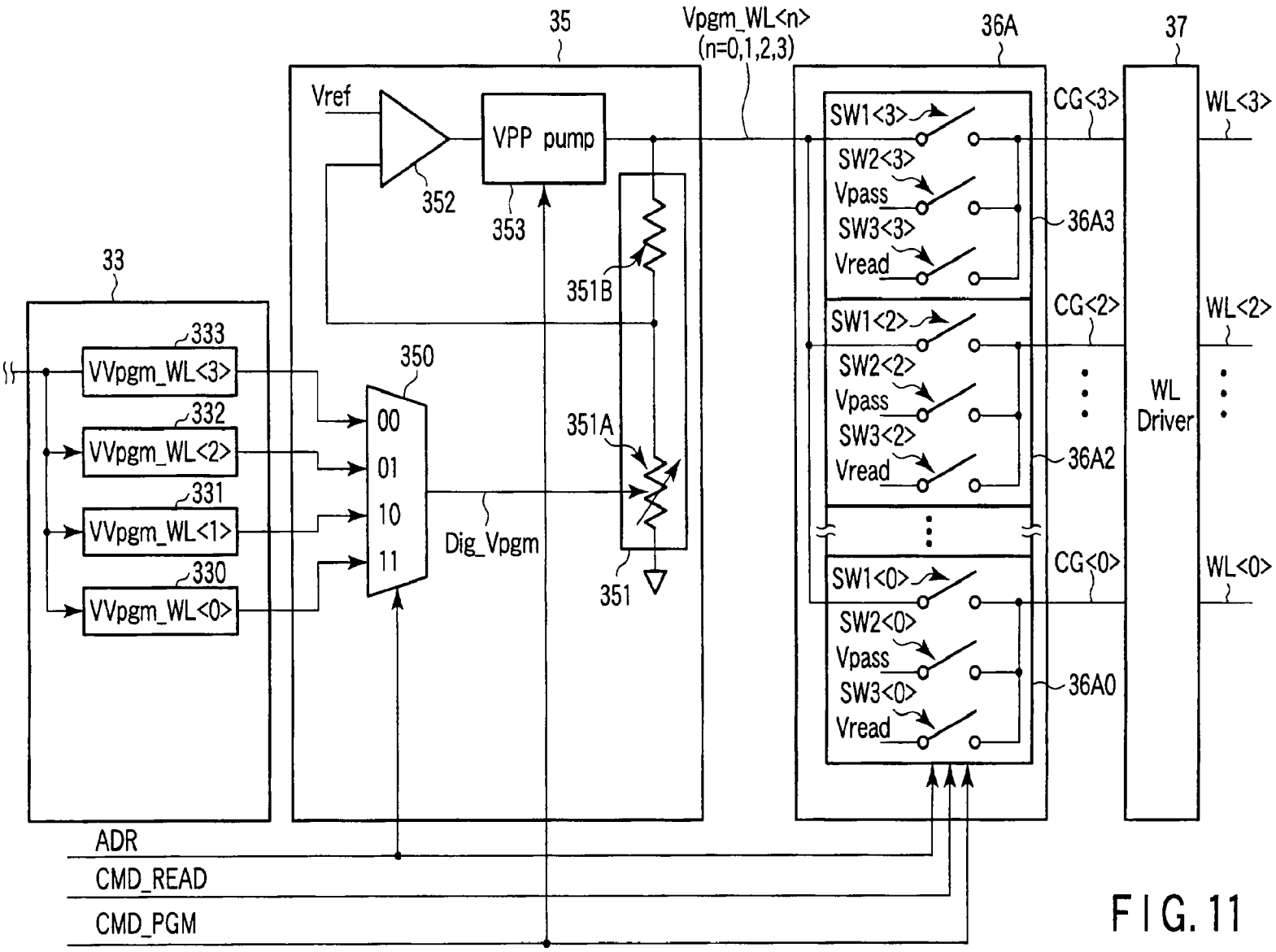
FIG. 11 is a circuit diagram schematically showing the configuration of internal circuits in the BiCS memory.
Figure 12:
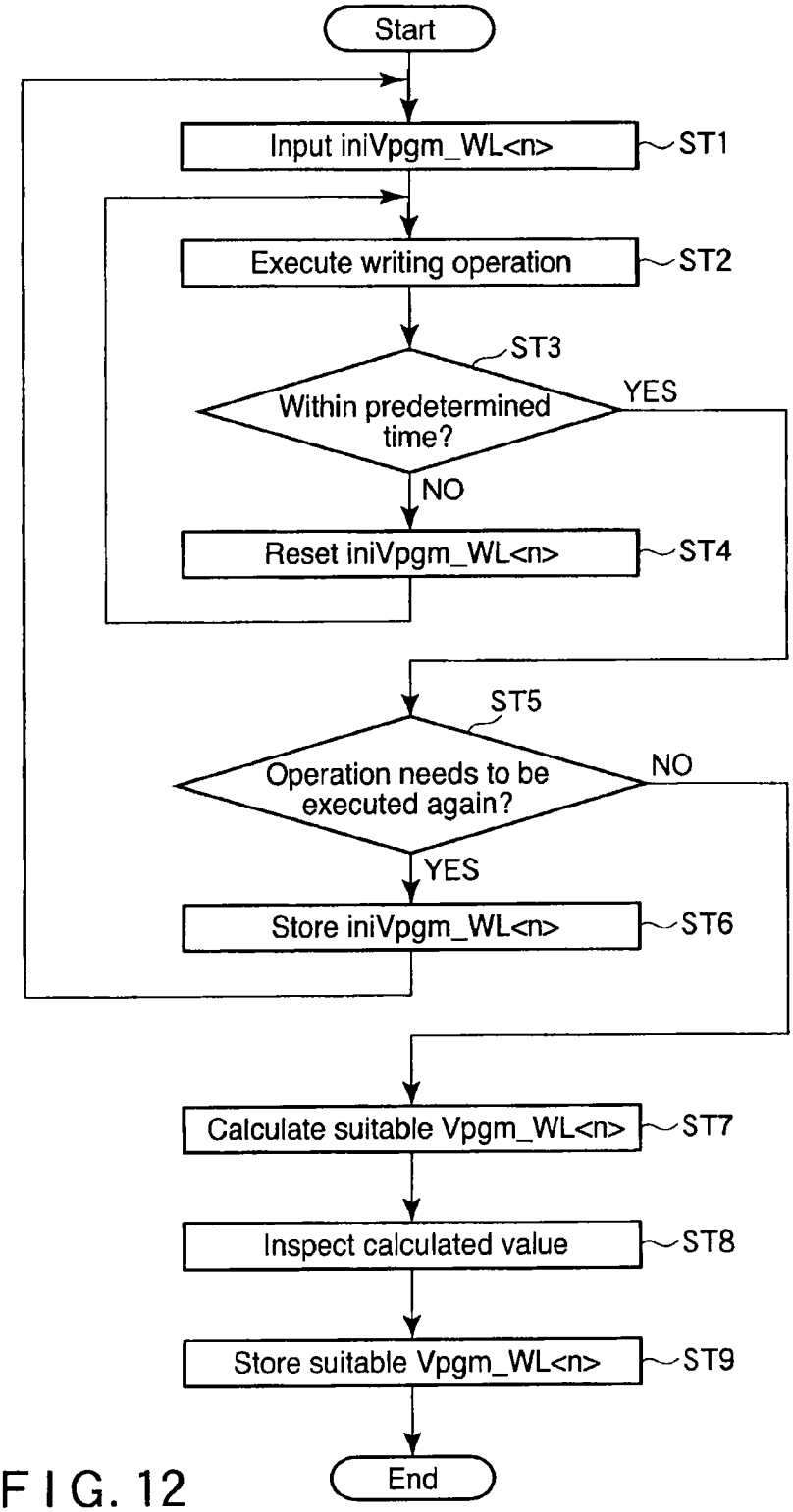
FIG. 12 is a flowchart for explaining a first adjustment example.
Figure 13:
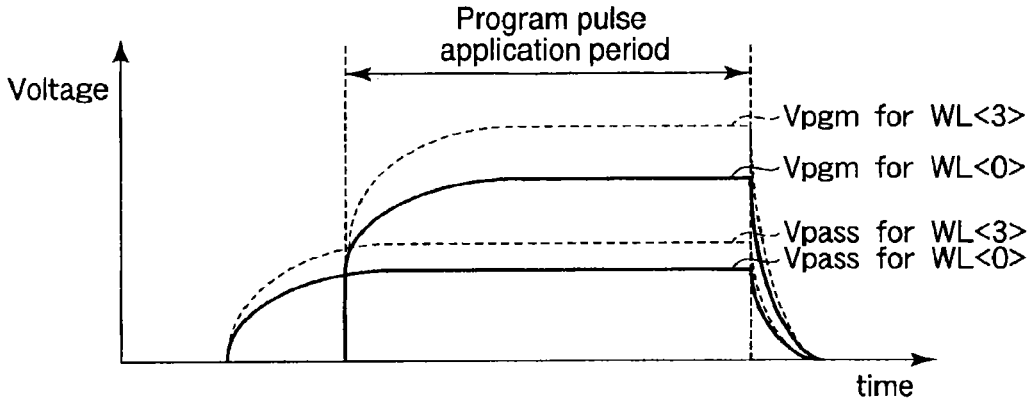
FIG. 13 is a graph for explaining the first adjustment example.

A first adjustment example in the embodiment of the present invention is described with FIGS. 11 to 13.

(a) Circuit Configuration

FIG. 11 shows the configuration of the circuits for supplying potentials to the word lines. FIG. 11 schematically shows one example of the internal configurations of the register circuit 33, the potential control circuit 35 and the row control circuit 36A out of the internal circuits in the BiCS memory chip 1.

The register circuit 33 has a plurality of registers 330 to 333. The registers 330 to 333 retain, as setting information, values (hereinafter referred to as potential codes) VVpgm_WL<0> to VVpgm_WL<3>, respectively, which are suitable for the corresponding word lines WL<0> to WL<3>. The potential codes VVpgm_WL<0> to VVpgm_WL<3> for the word lines retained in the registers are output to the potential control circuit 35. In the present embodiment, there are four word lines, and the four registers 330 to 333 corresponding to the four word lines WL<0> to WL<3> are therefore shown here. It goes without saying that the number of registers corresponding to the number of word lines is provided in the register circuit 33.

The potential control circuit 35 includes a selector (arithmetic unit) 350, a D/A converter 351, a comparator 352 and a VPP pump (potential generator) 353.

The selector 350 uses the address signal ADR as a selection signal to select a potential code corresponding to a write potential Vpgm_WL<n> of a selected word line from among the potential codes VVpgm_WL<0> to VVpgm_WL<3> retained in the registers 330 to 333. Then, the selector 350 converts a selected one of the potential codes VVpgm_WL<0> to VVpgm_WL<3> into a digital signal Dig_Vpgm, and outputs the digital signal Dig_Vpgm to the D/A converter 351. In this example, the number of word lines is four, so that n=0, 1, 2, 3.

The D/A converter 351 has a variable resistor 351A and a fixed resistor 351B. The resistance value of the variable resistor 351A is changed in accordance with the digital signal Dig_Vpgm selected by the selector 350.

The comparator 352 compares the output from the D/A converter 351 with a reference potential (reference value) Vref to control the potential generated by the VPP pump 353.

The VPP pump 353 outputs the write potential Vpgm_WL<n> to the row control circuit 36A in accordance with the output of the comparator 352 and a write command signal CMD_PGM. The write command signal CMD_PGM is a signal for a writing operation instruction. Moreover, a read command signal CMD_READ shown in FIG. 11 is a signal for a reading operation instruction.

The row control circuit 36A has a plurality of switch circuits 36A0 to 36A3. The plurality of switch circuits 36A0 to 36A3 are controlled by the address signal ADR and the external command signals CMD_PGM, CMD_READ. Under this control, the plurality of switch circuits 36A0 to 36A3 supply a potential to the word line indicated by the address signal via common interconnections CG<0> to CG<3> of the blocks in the memory cell array and via the word line driver 37.

For example, during writing operation, the row control circuit 36A controls switches SW1<0> to SW1<3> in the switch circuits 36A0 to 36A3 in accordance with the address signal ADR for the selected word line and the write command signal CMD_PGM so that the write potential Vpgm_WL<n> may be supplied to the selected word line WL<n>. At this moment, switches SW2<0> to SW2<3> are controlled so that the nonselection potentials Vpass may be supplied to nonselected word lines.

Furthermore, during reading operation, switches SW3<0> to SW3<3> are controlled so that the nonselection potentials Vread may be supplied to nonselected word lines except for a selected word line. At this moment, the ground potential Vss, for example, is supplied to the word line selected for reading.

Although not shown in FIG. 11, the nonselection potentials Vpass, Vread during the writing operation and the reading operation are separately generated using circuits substantially similar to the circuits 33, 35 for generating the write potential Vpgm_WL<n>.

In the first adjustment example of the present embodiment, when the first word line WL<0>, for example, is the selected word line, the potential code VVpgm_WL<0> retained in the register 330 of the register circuit 33 is selected in accordance with the address signal ADR as the selection signal of the selector 350. The potential code VVpgm_WL<0> retained in the register 330 indicates the value of the write potential Vpgm_WL<0> to be supplied to the selected word line WL<0> indicated by the address signal ADR.

The selector 350 outputs the selected potential code to the D/A converter 351 as a digital value Dig_Vpgm, and the D/A converter 351 (variable resistor 351A) outputs an analog value to the comparator 352 in accordance with the input digital value Dig_Vpgm.

The comparator 352 compares the output value of the D/A converter 351 with the reference potential Vref to control the operation of the VPP pump 353. Under the control of the comparator 352, the VPP pump 353 then generates the write potential Vpgm_WL<0> to be supplied to the selected word line WL<0>.

Thus, the potential control circuit 35 generates a supply potential suitable for the selected word line WL<0> in accordance with the potential code (setting information) for each word line retained in the register circuit 33, and the generated potential is supplied to the selected word line WL<0> via the row control circuit 36A and the word line driver 37.

Similarly, the registers 331 to 333 in the register circuit 33 correspond to the second to fourth word lines WL<1> to WL<3>, respectively. In accordance with the address signal ADR input to the selector 350, the potential codes VVpgm_WL<1> to VVpgm_WL<3> retained in the registers 331 to 333 are selected, and the potential Vpgm_WL<n> suitable for each of the word lines WL<1> to WL<3> is generated by the potential control circuit 35. Then, the generated potential is supplied to the selected word line.

As described above, the supply potential (e.g., a write potential) suitable for each of the word lines WL<0> to WL<3> is generated by the circuits shown in FIG. 11 in accordance with the potential code retained in the register circuit, and the generated potential can be supplied to the selected word line.

Consequently, according to the BiCS memory (three-dimensionally stacked nonvolatile semiconductor memory) in the first adjustment example of the embodiment of the present invention, the characteristic variations of the memory cells can be compensated for.

(b) Adjustment Method

A method of acquiring a potential suitable for each of the word lines is described with FIG. 12. In addition, the method is described here using FIGS. 7, 8 and 11.

FIG. 12 is a flowchart for explaining the operation of adjusting the word line supply potential to a potential suitable for each of the word lines. FIG. 13 is a graph showing one example of the relation between the time of potential application to the word line and the intensities of the supply potentials during writing of data.

For example, the BiCS-NAND flash memory is configured to complete writing with a constant pulse width and a constant number of pulses so that the writing speed (writing time) of the memory cell may be constant. Therefore, when there are variations in shape as shown in FIG. 6, the write potential provided to the upper side (bit line side) word line WL<3> is greater than the potential provided to the lower side (semiconductor substrate side) word line WL<0> if writing of data is set to be achieved within the constant writing time as shown in FIG. 13. In the case of the nonselection potential Vpass for sufficiently boosting up the channel area of the nonselected cell during the writing operation, the potential provided to the upper side word line WL<3> is also greater than the potential provided to the lower side word line WL<0>.

Specifically described here is an operation wherein in the step of testing the BiCS memory chip 1, an initial write potential iniVpgm_WL<n> provided to the word line is adjusted so that a write potential which allows writing of data to be finished within a predetermined writing time is set as a write potential suitable for each of the word lines WL<0> to WL<3> (hereinafter referred to as trimming processing).

First, as shown in FIG. 12, the address signal ADR and a value (potential code) indicating the intensity of the initial write potential iniVpgm_WL<n> are input to the internal circuits in the BiCS memory chip 1 from outside of the memory chip 1 (e.g., the controller 2) via the control pins 11A as to 11G and the I/O pin 11H.

The address signal ADR indicates the addresses of the selected word line and the selected cell, and is input to the potential control circuit 35 and the row/column control circuits 36A, 36B.

The potential code indicating the intensity of the initial write potential iniVpgm_WL<n> is retained in the registers 330 to 333 of the register circuit 33 in accordance with the input address signal ADR (step ST1). This initial write potential iniVpgm_WL<n> is a potential of given intensity applied to a certain word line WL<n> (in the present embodiment, n=0, 1, 3, 4).

In accordance with the input address signal ADR and the potential code (setting information), the initial write potential iniVpgm_WL<n> is generated by the potential control circuit 35 shown in FIGS. 8 and 11. Further, the row/column control circuits 36A, 36B shown in FIG. 8 drive the word line driver 37 and the data cache/sense amplifier 38, and the word line and the bit line indicated by the address signal ADR are selected.

Using the initial write potential iniVpgm_WL<n>, given write data separately input from the I/O pin 11H is written into the selected cell connected to the selected word line (here, the first word line WL<0>) (step ST2).

At this point, whether the data has been written within a predetermined period is judged (step ST3). The writing time is judged in such a manner that the controller 2 (or the host 3) provided outside the memory chip 1 performs monitoring at predetermined time intervals. This monitoring is performed in accordance with the output from the control pin 11G which is provided in the memory chip 1 and which corresponds to the ready/busy signal (R/B) or in accordance with a busy status judgment obtained via the I/O pin 11H.

In addition, the threshold voltage of the memory cell after writing shows a given distribution shape depending on how the data is stored therein. Thus, it is possible to use a method wherein the controller 2 (or the host 3) acquires the distribution shape of the threshold voltage to judge whether data has been written in the predetermined distribution shape within a given time by the initial write potential used for writing.

When writing of the data is completed within the predetermined writing time (predetermined period), the initial write potential iniVpgm_WL<n> provided to the selected word line WL<0> is judged to be a potential suitable as the write potential for the selected word line WL<0>. Then, this initial write potential iniVpgm_WL<0> is set as the write potential Vpgm_WL<0> for the selected word line WL<0>.

When writing of the data is not completed within the predetermined period, the initial write potential iniVpgm_WL<0> provided immediately before the writing is judged to be unsuitable. Then, in order to obtain a potential suitable for a write potential to be provided to the selected word line (the first word line WL<0>), the value provided immediately before the writing is replaced with another value to reset a new initial write potential (step ST4).

Furthermore, data is written again into the memory cell connected to the same selected word line WL<0>, and whether the writing has been finished within the predetermined time is judged (steps ST2, ST3). In this manner, the operation from step ST2 to step ST4 is repeated until an initial write potential which allows writing of data to be finished within the predetermined period is obtained.

For example, when writing of data considerably exceeds the predetermined period, the set initial write potential iniVpgm_WL<0> is judged to be too low, and the value of this initial write potential is increased to run a test again. In contrast, when writing of data is considerably shorter than the predetermined period, this means good writing characteristics of the memory cell, and there is no need to reset the initial write potential. However, considering deterioration over long-term use, a more suitable write potential Vpgm_WL<0> may also be obtained when writing of data is much shorter than the predetermined period.

When it is judged that data has been written within the predetermined period, whether to perform the trimming processing for the same word line again is judged considering statistical variations and manufacturing variations of the plurality of memory cells connected to one word line (step ST5). In addition, whether to perform the trimming processing for the same word line may be judged considering the time required for the test and the accuracy of the test.

When it is judged that the trimming processing is performed again for the same word line, a potential code having a value obtained by the trimming processing in steps ST1 to ST4 is stored in a setting information storage area (not shown) of the memory cell array 30 in the BiCS memory chip 1 or stored in a storage area (not shown) of the controller 2 or the host 3 outside the BiCS memory chip in order to obtain a more desirable trimming value of the write potential by use of averaging processing or minimum value searching processing (step ST6).

Subsequently, the trimming processing is performed again for, for example, the word line for which the supply potential (write potential) has been once adjusted. When the trimming processing is thus performed more than one time for the same word line, the trimming processing may be performed more than one time for the same memory cell connected to the same word line or for a different memory cell connected to the same word line.

When it is judged in step ST5 in FIG. 12 that the trimming processing is not performed again for the same word line, arithmetic processing such as the averaging processing, the minimum value searching processing and abnormal value exclusion is performed by the controller 2 (or the host 3) provided outside the BiCS memory chip 1 in order to obtain a trimming value suitable for the word line which has been subjected to the trimming processing (step ST7). A potential Vpgm_WL<n> is obtained as a result of the arithmetic processing. In the case where a suitable potential is obtained by the trimming processing one time, the flow may move to the next step without performing the above-mentioned arithmetic processing.

Furthermore, the arithmetic result is inspected with regard to the word line which has been subjected to the trimming processing by use of the trimming value (step ST8). The arithmetic result is thus inspected for the following reason. As a BiCS memory having high storage capacity is generally shipped permitting a certain number of defective bits and defective blocks, a certain percentage of defective bits or defective blocks may also be contained in the test step that uses the trimming processing as in this example. When it is detected in the process of inspecting the arithmetic result that a block includes an abnormal value and it is judged that the block should be treated as a defective cell (defective block), defect processing is separately performed, including, for example, replacement with a redundant block or bad block processing.

After it is judged by the inspection step ST8 that the obtained potential Vpgm_WL<n> is a proper trimming value, this trimming value is treated as a potential suitably supplied to the word line WL<0> which has been subjected to the trimming processing. Then, a potential code corresponding to this potential (trimming value) is written into the setting information area (not shown) of the memory cell array 30 in the BiCS memory chip 1 or into the register circuit 33 in accordance with a command signal from the controller 2 (or the host 3) (step ST9).

Thus, the trimming processing for the word line targeted for the adjustment of the supply potential ends.

As described above, the initial write potential iniVpgm_WL<n> is adjusted so that the write potential Vpgm_WL<n> suitable for each of the plurality of word lines (in the present embodiment, four word lines) in the memory cell army 30 may be obtained.

Therefore, according to the BiCS memory in the first adjustment example of the embodiment of the present invention, the characteristic variations of the memory cells constituting the BiCS memory can be compensated for.

In the case described in the present adjustment example, the potential provided to the first word line WL<0> is adjusted and set. However, it goes without saying that the potentials provided to the second to fourth word lines WL<1> to WL<3> can also be adjusted and set to suitable potentials by use of steps ST1 to ST9 shown in FIG. 12.

Moreover, although the trimming processing for the write potential provided to each of the plurality of word lines has been illustrated in the present adjustment example, the non-selection potential Vpass for writing operation or the selection potential/nonselection potential for reading operation can also be adjusted and set to a potential suitable for each of the word lines by use of a similar circuit configuration and method.

(3.2) Second Adjustment Example (a) Circuit Configuration

Figure 14:
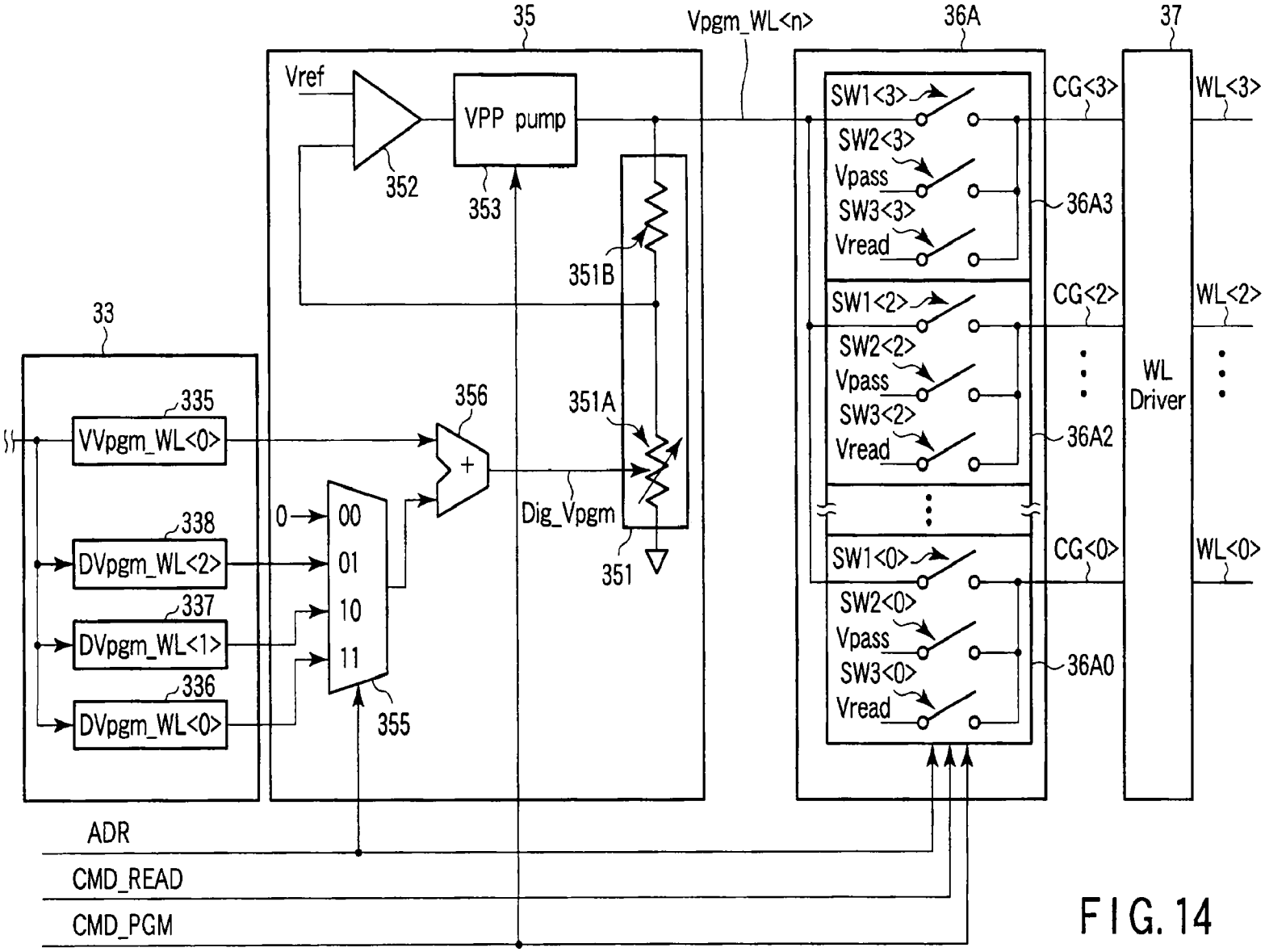
FIG. 14 is a circuit diagram schematically showing the configuration of the internal circuits in the BiCS memory.

A second adjustment example for the potentials provided to the word lines is described with FIG. 14. It should be noted that in the present adjustment example, the same symbols are assigned to the same components as the components in the first adjustment example described above and a detailed description of such components are given as needed.

FIG. 14 shows the configuration of the circuits used in the second adjustment example of the embodiment of the present invention.

The register circuit 33 in the present adjustment example has a plurality of registers 335 to 338. One (first register) 335 of these registers retains a reference value of a potential suitable for use in writing or reading. This reference value is, for example, a value which indicates a potential to be supplied to a certain word line, and in the description of this example, a potential code VVpgm_WL<0> indicating a write potential to be supplied to the first word line WL<0> is the reference value (hereinafter referred to as a reference code).

The other registers (second registers) 336, 337, 338 provided in the register circuit 33 respectively retain potential codes (hereinafter referred to as difference codes) DVpgm_WL<1>, DVpgm_WL<2>, DVpgm_WL<3>. Each of these potential codes DVpgm_WL<1>, DVpgm_WL<2>, DVpgm_WL<3> corresponds to a difference value between the potential serving as the reference value and supplied to the first word line WL<0> and the write potential to be supplied to each of the other word lines WL<1>, WL<2>, WL<3>.

Instead of the selector 350 in FIG. 11, a selector 355 and an adder 356 are provided in the potential control circuit 35 in FIG. 14.

The selector (arithmetic unit) 355 uses an address signal ADR as a selection signal to select one of the inputs from the registers 336 to 338, and outputs the selected input to the adder (arithmetic unit) 356. In addition, the write potential for the first word line WL<0> is the reference value, so that when an address signal ADR indicating the first word line WL<0> is input, the selector 355 outputs "0" to the adder 356.

The adder 356 adds the reference code VVpgm_WL<0> to one of the difference codes DVpgm_WL<1> to DVpgm_WL<3> output from the selector 355. This additional value is provided to the variable resistor 351A forming the D/A converter 351, as a digital value Dig_Vpgm for a write potential to be supplied to the selected word line.

Thus, in the present adjustment example, a potential suitable for each of the word lines WL<0> to WL<3> is generated in accordance with the reference code VVpgm_WL<0> for a write potential and the difference code DVpgm_WL<1>, DVpgm_WL<2>, DVpgm_WL<3>, and the potential is supplied to the selected word line.

In the present adjustment example, the potential to be supplied to a certain word line (here, the first word line WL<0>) is set as the reference value (reference code). In this case, the potential to be supplied to each of the other word lines WL<1> to WL<3> can be retained in each register as a difference value (difference code) with respect to the reference value.

For example, when a write potential is represented by 8 bits, a register of 8 bits is needed for each of the word lines in the first adjustment example.

In contrast, in the present adjustment example, although it depends on the extent that a write potential is represented, the difference code can be represented by a smaller number of bits than the reference code. For example, when the reference code is represented by 8 bits, the registers 336 to 338 for retaining the difference codes can supply potentials suitable for the respective word lines as in the first adjustment example if these registers can indicate a maximum of 7 bits. Thus, the storage capacities of the registers 336 to 338 can be lower, such that the registers 336 to 338 can be smaller in size.

Thus, according to the second adjustment example, the characteristic variations of the memory cells can be compensated for by the reference code indicating the reference value of the supply potential retained in the register circuit 33 and by the difference codes, and the size of the memory chip can be reduced.

In addition, in the present adjustment example, the write potential used as the reference value and supplied to the first word line WL<0> tends to be lower than the write potentials for the other word lines WL<1> to WL<3> (see FIG. 13). Therefore, when the write potential supplied to the first word line serves as the reference value as in the present adjustment example, a write potential equal to or higher than the reference value is set and generated, so that the circuit configuration includes the adder 356. This can make a contribution to easier control of the circuits and to the reduction in circuit scale. On the contrary, when the potential supplied to the fourth word line WL<3> is the reference value, the write potential supplied to the fourth word line tends to be higher than the write potentials for the other word lines. Therefore, in this case, write potentials equal to or lower than the reference value are set and generated for the other word lines WL<0> to WL<2>, so that a circuit configuration which uses a subtracter instead of the adder 356 is preferable.

(b) Adjustment Method

In the second adjustment example, a write potential suitable for each word line is adjusted and set by an operation substantially similar to that in steps ST1 to ST9 shown in FIG. 12.

As described above, in this example, the supply potential for a certain word line (e.g., the first word line WL<0>) is used as the reference value (reference code VVpgm_WL<0>), and for the supply potential for each of the other word lines WL<1> to WL<3>, a difference value (difference code DVpgm_WL<1>, DVpgm_WL<1>, DVpgm_WL<3>) with respect to the reference value VVpgm_WL<0> is obtained.

Thus, the write potential Vpgm_WL<0> suitable for the first word line WL<0> and serving as the reference value is set by the trimming processing shown in FIG. 12.

In the trimming processing for the second to fourth word lines WL<1> to WL<3>, given difference codes DVpgm_WL<1> to DVpgm_WL<3> are added to the reference code VVpgm_WL<0>, such that the supply potentials are adjusted, and supply potentials suitable for the other word lines WL<1> to WL<3> are set.

Then, the reference code indicating the supply potential (reference potential) suitable for the referential word line, and the difference codes DVpgm_WL<1> to DVpgm_WL<3> indicating the difference values between the reference potential and the supply potentials suitable for the other word lines WL<1> to WL<3> are stored in the register circuit 33 and the memory cell array 30.

As described above, in the second adjustment example as well, a potential of given intensity can be adjusted to set a word line supply potential suitable for each of the word lines WL<0> to WL<3>.

Thus, in the second adjustment example of the embodiment of the present invention, each of the word lines WL<0> to WL<3> of the BiCS memory can be supplied with the potential suitable therefor as in the first adjustment example.

Consequently, in the second adjustment example of the embodiment of the present invention, the characteristic variations of the memory cells can be compensated for as in the first adjustment example.

(3.3) Third Adjustment Example

A BiCS memory according to a third adjustment example of the embodiment of the present invention is described with reference to FIGS. 15 to 17. It should be noted that the same symbols are assigned to the same components as the components in the first and second adjustment examples and such components are described as needed.

As has been described with FIGS. 5 and 6, in the BiCS memory, fabrication dimensions such as the diameter of the hole in which the active layers are embedded tend to be smaller on the lower side (semiconductor substrate side) than on the upper side. For example, when the addresses (formation positions) of the word lines WL<0> to WL<3> are correlated with the variations in the hole diameter, the addresses of the word lines and several coefficients are provided to acquire an approximation function, and this approximation function may be used to enable the supply of potentials suitable for the word lines.

In the illustration of the present adjustment example, variations in shape (fabrication) are represented by an approximation function, and a potential suitable for each of the word lines is set and supplied using the approximation function. In addition, approximation using a linear function is illustrated in this example.

(a) Circuit Configuration

Figure 15:
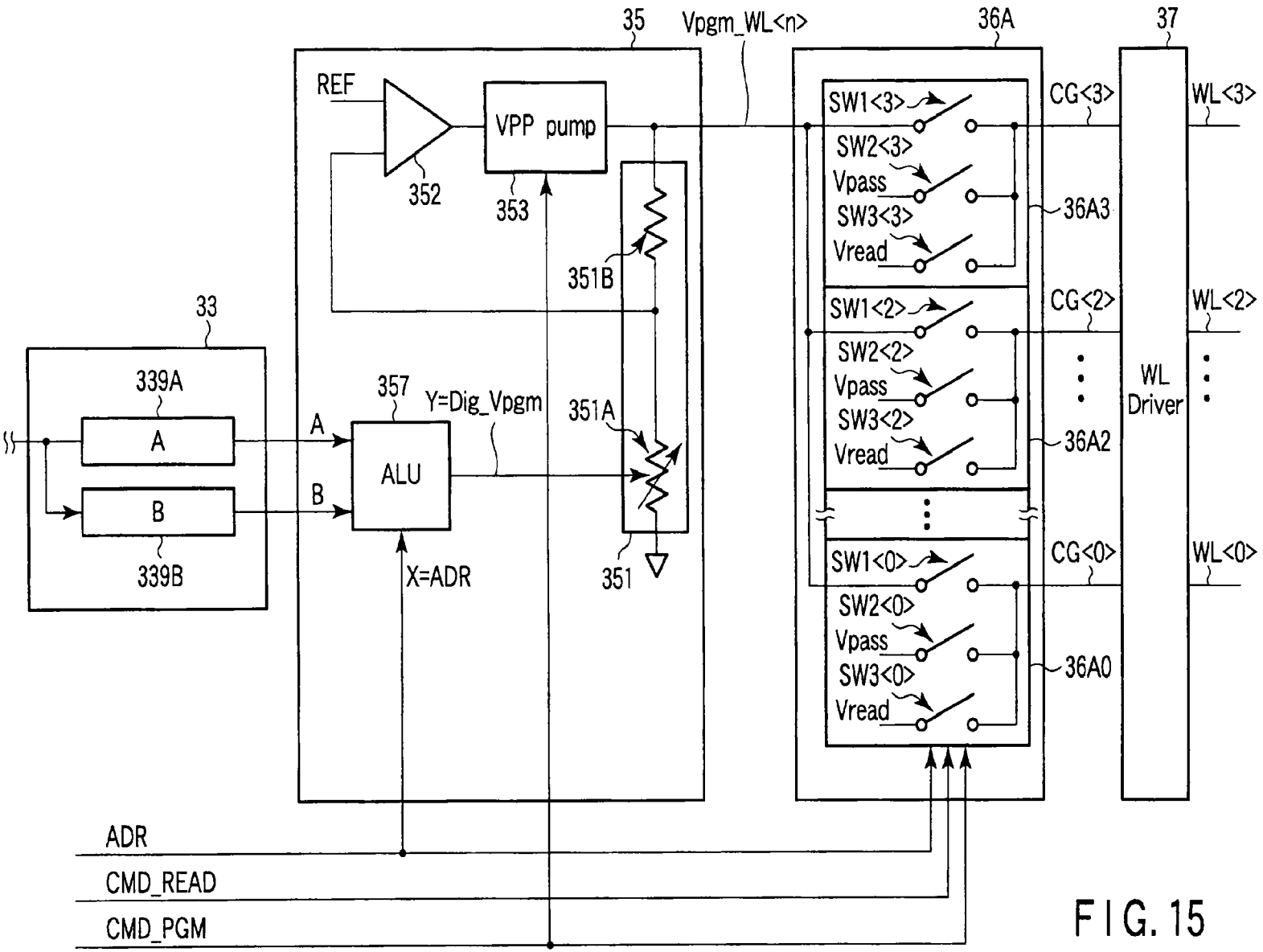
FIG. 15 is a circuit diagram schematically showing the configuration of the internal circuits in the BiCS memory.

FIG. 15 shows the configuration of the circuits used in the third adjustment example of the embodiment of the present invention.

The register circuit 33 in this example has registers 339A, 339B for retaining coefficients A, B of a linear function. In this example, potentials supplied to the word lines are adjusted and set by the linear function, so that there are provided two registers for retaining the coefficient A indicating the inclination of the linear function and the coefficient B indicating the intercept of the linear function. However, it goes without saying that the number of registers varies depending on the order of the approximation function.

In the potential control circuit 35, an arithmetic circuit 357 is provided instead of the selector and the adder. The coefficients A, B output from the register circuit 33 and an address signal ADR of a selected word line are input to the arithmetic circuit 357. In this example, the address signal ADR is a variable X. This arithmetic circuit 357 executes arithmetic processing, for example, on the basis of a linear function Y=AX+B. More specifically, in the case of Y=A×X (X−ADR)+B, the multiplication A×X is first performed and then the addition of the coefficient B is performed in the arithmetic circuit 357.

Furthermore, the arithmetic circuit 357 outputs the calculated value Y to the D/A converter 351 as a digital value Dig_Vpgm.

Thus, when the calculated value Y (=Dig_Vpgm) can be represented by the linear function of the write selection address signal ADR, the coefficient A corresponding to the inclination and the coefficient B corresponding to the intercept are set, so that the potential suitable for each of the word lines can be supplied.

In the case of the present adjustment example, the two coefficients are treated as setting information for supplying the potentials suitable for the respective word lines. Therefore, the present adjustment example requires neither the use of the registers 330 to 333 for retaining the potential codes of the potentials suitable for the respective word lines for all of the word lines WL<0> to WL<3> as in the first adjustment example nor the use of the registers 335 to 338 for retaining the reference code and the difference codes for the respective word lines as in the second adjustment example. That is, when the characteristic variations are approximated by the linear function as in the present adjustment example, two registers 339A, 339B have only to be disposed in the register circuit 33.

Therefore, the present adjustment example enables a reduction in the number of registers, that is, a reduction in the scale of the register circuit 33. Especially, the effects of the present adjustment example are greater, for example, when the number of word lines is increased along with the increase of storage capacity.

Therefore, according to the third adjustment example of the embodiment of the present invention, the potential supplied to each of the word lines is represented by the linear function so that the potential may be suitable for each of the word lines, thereby making it possible to compensate for the characteristic variations of the memory cells and contribute to the size reduction of the memory chip.

(b) Adjustment Method

Figure 16:
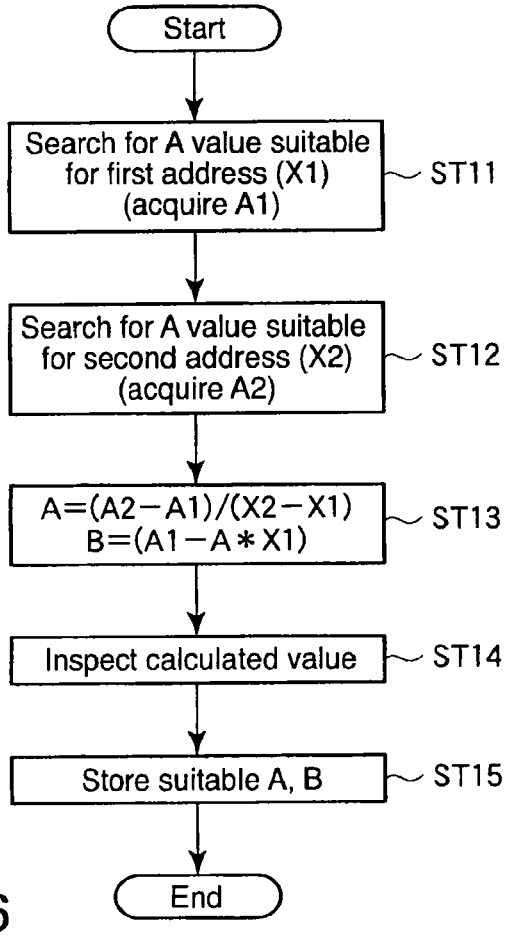
FIG. 16 is a flowchart for explaining a third adjustment example.
Figure 17:
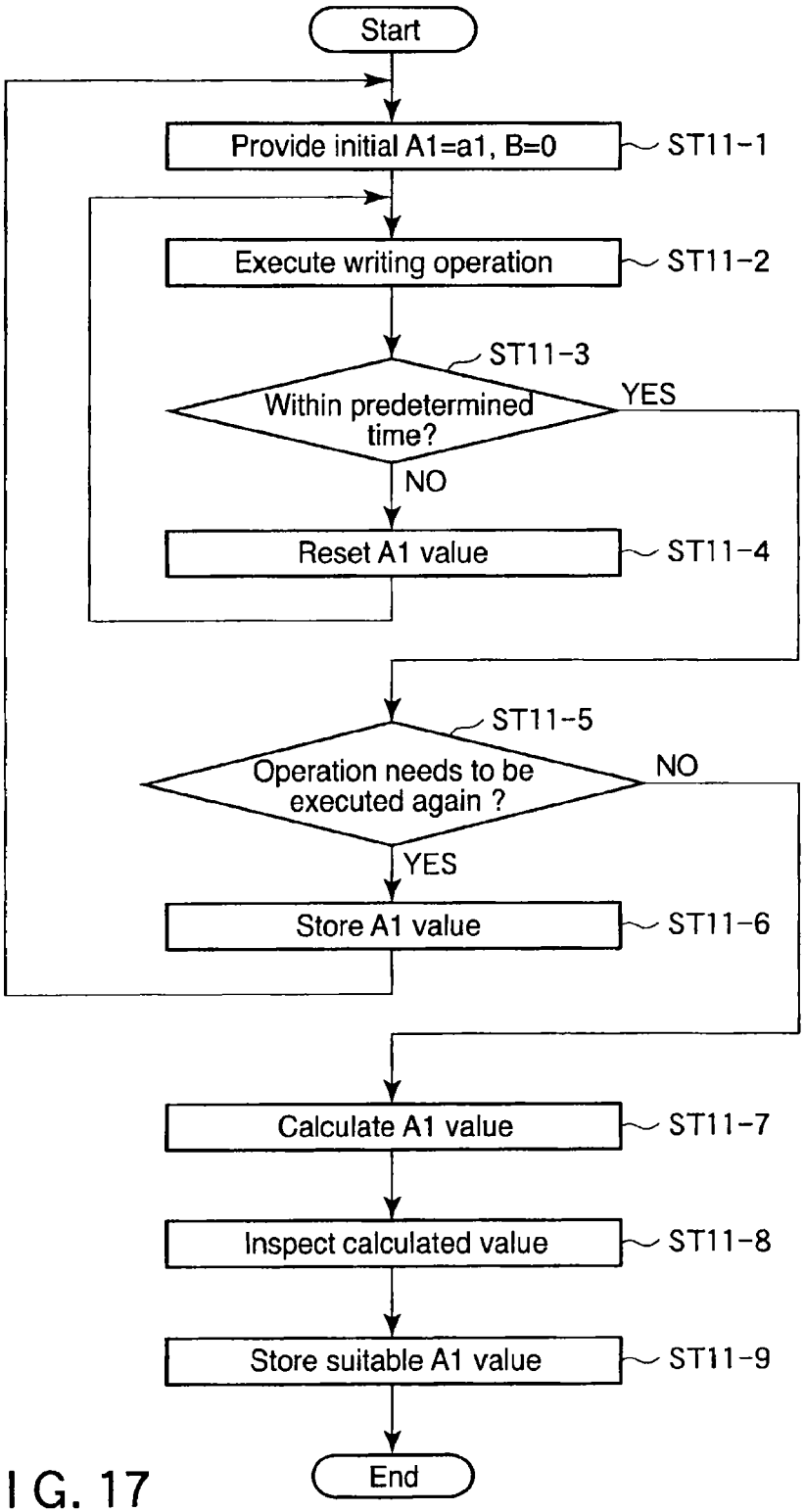
FIG. 17 is a flowchart for explaining the third adjustment example.

In this example, a method of acquiring the coefficients A, B of the linear function used as the approximation function is described with FIGS. 16 and 17. In the method described here, trimming processing is performed for at least two different word lines, and an approximation function for providing a potential suitable for each of the word lines is derived from the difference between the addresses of the word lines and the difference between write potentials obtained by the trimming processing.

The two coefficients A, B are indeterminate before the trimming processing. Therefore, in the example described here, an arithmetic operation to acquire the coefficients A, B is performed by use of the separately provided address signal ADR serving as the variable X, wherein the coefficient B corresponding to the intercept of the linear function is fixed at a given value, while the coefficient A is changed.

First, as shown in FIG. 16, the operation of acquiring the coefficient A is executed for the word line corresponding to the address signal ADR=X1 (ST11). This search for the coefficient A is performed by steps ST11-1 to ST11-9 shown in FIG. 17. Specifically, this operation is as follows:

As shown in FIG. 17, an initial value a1 is provided to a coefficient A1, and an initial value 0 is provided to the coefficient B (ST11-1).

Then, using the address signal X1 indicating a certain word line (selected word line) and write data, data is written into the memory cell connected to the selected word line (ST11-2). Further, for example, as in the trimming processing described in the first adjustment example, whether the data has been written within a predetermined period is judged (ST11-3). Here, when writing of the data is not completed within the predetermined period, the initial value a1 is an inappropriate value. Thus, a value different from the value a1 is reset (ST11-4), and an initial value a1 which allows writing of the data to be completed within the predetermined period is searched for.

When writing of the data has been completed within the predetermined period, it is judged as in the first adjustment example whether to reset the coefficient A1 to a different value for the same memory cell belonging to the same word line or a different memory cell belonging to the same word line to perform writing (ST11-5).

When sampling of the coefficient A1 is performed again, the coefficient A1 obtained by steps ST11-1 to ST11-4 are temporarily stored in, for example, a storage outside the chip 1 (ST11-6).

When it is judged in step ST11-5 that sampling of the coefficient A1 is not performed again, the search for the coefficient A for the word line corresponding to the address X1 is ended. When sampling of the coefficient A1 is performed a plurality of times, arithmetic processing such as averaging processing for a plurality of coefficients, the minimum value searching processing and abnormal value exclusion is performed, so that the coefficient A1 is standardized (ST11-7). When the sampling process of the coefficient A1 is performed only once, the obtained value is set as a coefficient A1.

Subsequently, if necessary, the coefficient A1 is inspected to exclude any abnormal value (ST11-8). Then, the coefficient A1 suitable for the address signal X1 is temporarily retained in the storage area (not shown) provided in the controller 2 or in the setting information area of the memory cell array 30 (ST11-9).

As a result, the coefficient A=A1 suitable for the address signal X1 is acquired, and the search for the coefficient A1 for the address signal X1 is completed.

Then, for an address X2 indicating a word line different from the initially selected word line, a coefficient A=A2 suitable for this word line is searched for by an operation similar to the operation in ST11-1 to ST11-9 for obtaining the coefficient A1 (ST12). Thus, the coefficient A=A2 suitable for the word line corresponding to the address signal X2 is acquired.

In the case of the approximation to the linear function as in this example, the coefficients A, B are obtained by using, for example, a two-point approximation (ST13).

As the coefficient A indicates the inclination of the linear function, the coefficient A is calculated here from sample data for the two points (two address signals) X1, X2 by the following equation:

$$A=(A2-A1)/(X2-X1)$$

Furthermore, the coefficient B indicates the intercept of the linear function, the coefficient B is calculated by the following equation using, for example, the calculated coefficient A, the address X1 and a sample value Y1 at the address X1:

$$B=Y1-A\times X1$$

Consequently, the linear function Y=AX+B as an approximation function is obtained. In addition, the coefficient B may be obtained by the following equation:

$$B=Y2-A\times X2$$

Subsequently, the obtained approximation function is inspected (ST14), and the coefficients A, B of the approximation function are stored (ST15).

As described above, in the third adjustment example of the embodiment of the present invention as well, characteristic variations are represented by the approximation function, so that the characteristic variations of the memory cells can be compensated for.

Although the coefficients A, B are calculated by the two-point approximation here, the number of samples may be increased to improve accuracy.

Moreover, the example shown here illustrates one method of setting the coefficients A, B suitable for the approximation function for providing potentials suitable for the respective word lines. As long as the characteristic variations of the memory cells can be compensated for using the approximation function, the present invention is not limited to the example in FIGS. 16 and 17.

2. Modification

Figure 18:
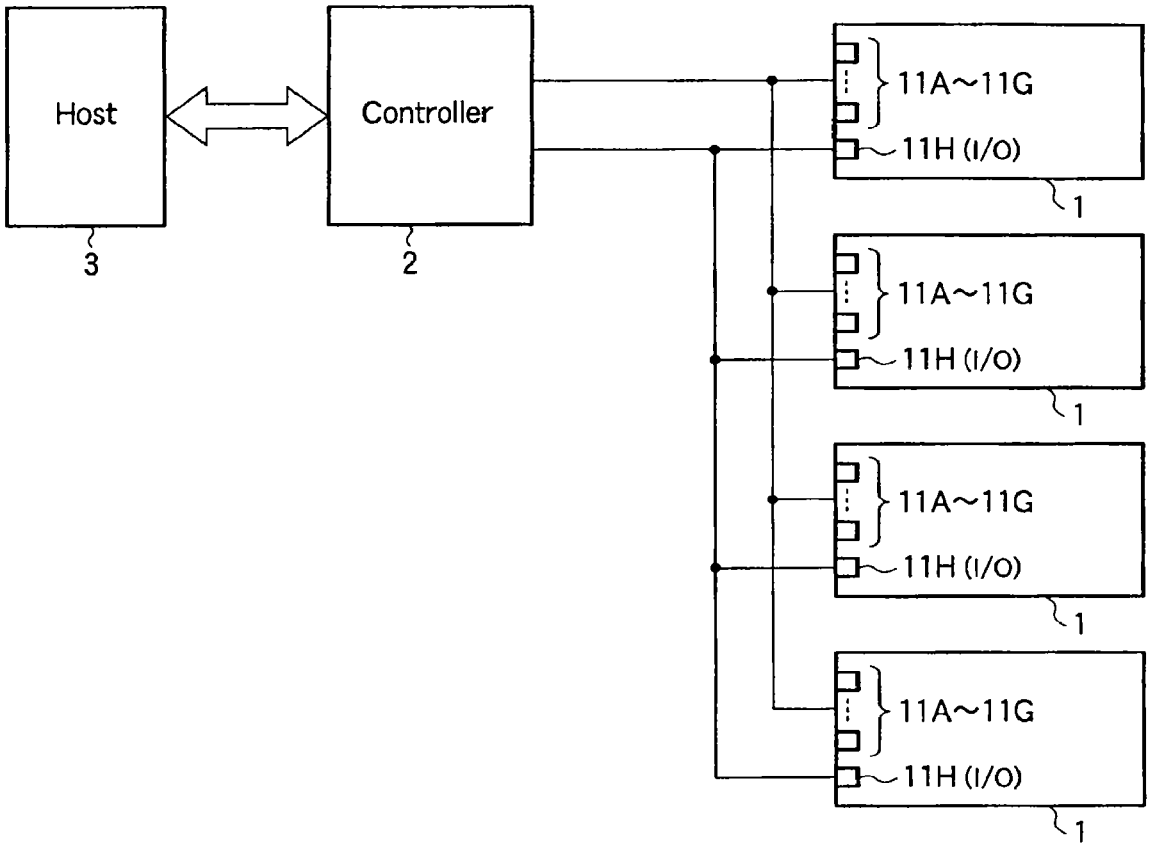
FIG. 18 is a diagram for explaining a modification of an embodiment of the present invention.

A modification of the embodiment of the present invention is described with FIG. 18. It should be noted that the same symbols are assigned to the same members as the members described above and such members are described as needed.

In the configurations described in the first to third adjustment examples, the internal circuits provided in the memory chip 1 such as the register circuit 33 and the potential control circuit 35 are used to adjust and set the potential provided to each of the word lines to a suitable potential. However, in the embodiment of the present invention, an instruction (command) from the controller 2 or the host 3 may be output to the memory chip 1 via the pads 11A to 11H to adjust the supply potential for each of the word lines to a potential suitable therefor.

In FIG. 18, for example, four memory chips 1 are connected in parallel to one controller 2. In this configuration, instructions for writing, erasing or reading in the memory cells in each of the memory chips 1 are given by the command issued by the controller 2. At the same time, for example, the setting and adjustment of the supply potentials described in the first to third adjustment examples may also be carried out using the I/O pin 11H and the control pins 11A to 11G so that a suitable potential is supplied to each of the selected word lines. Moreover, the write voltages of the word lines may also be adjusted by the command from the host 3.

Thus, the devices outside the memory chip 1 such as the controller 2 and the host 3 can be used to adjust the supply potential for each of the word lines.

Consequently, in the modification of the embodiment of the present invention, the characteristic variations of the memory cells can be compensated for.

3. Application

The technique of the present invention is advantageous to a BiCS-NAND flash memory in which one cell unit is composed of a plurality of serially connected memory cells (NAND strings) to achieve bit cost scalability. While one example of the BiCS-NAND flash memory has been described with FIGS. 1 to 4, the BiCS memory used in the embodiment of the present invention is not limited thereto.

Figure 19:
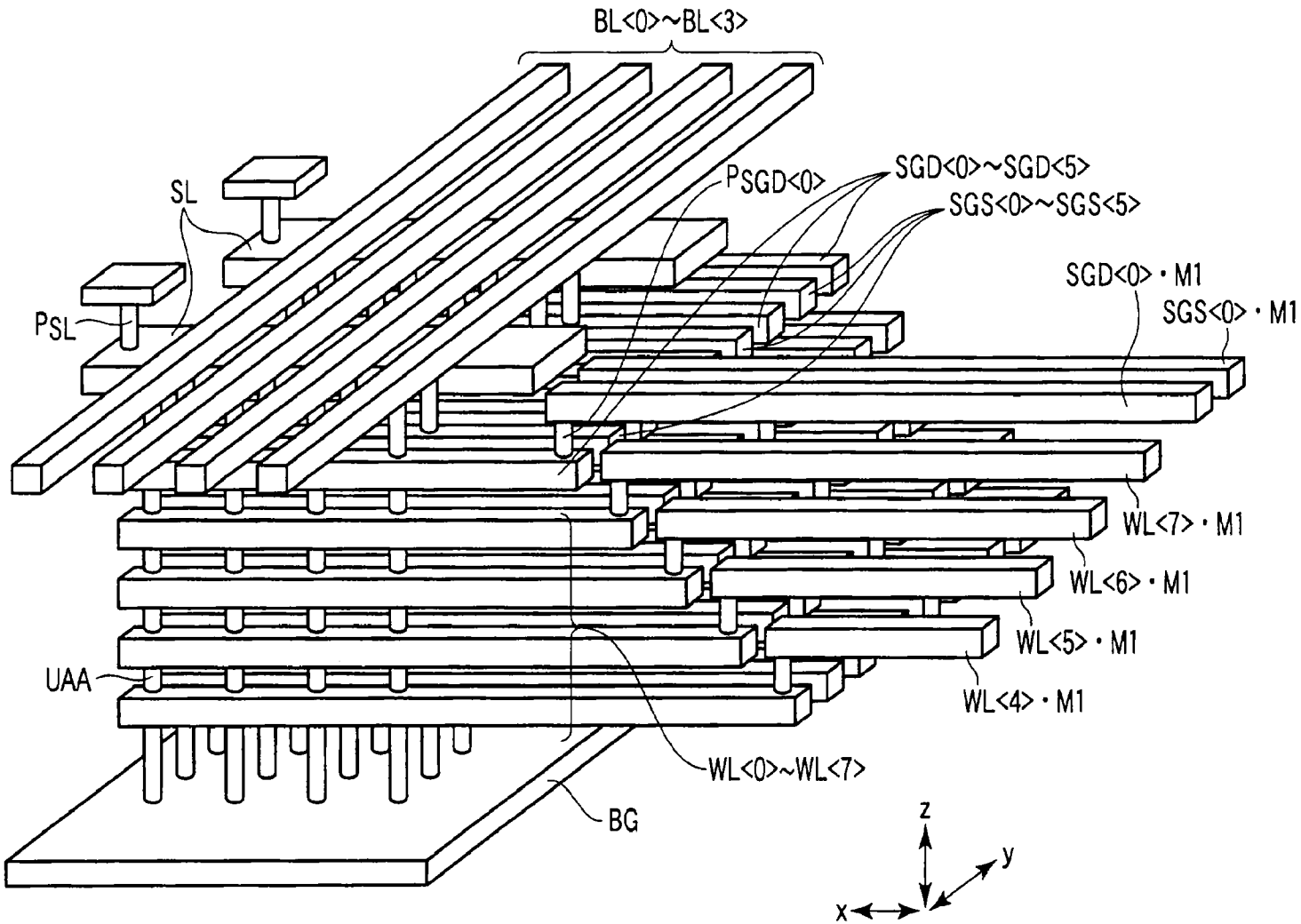
FIG. 19 is a diagram for explaining an application of the embodiment of the present invention.
Figure 20:
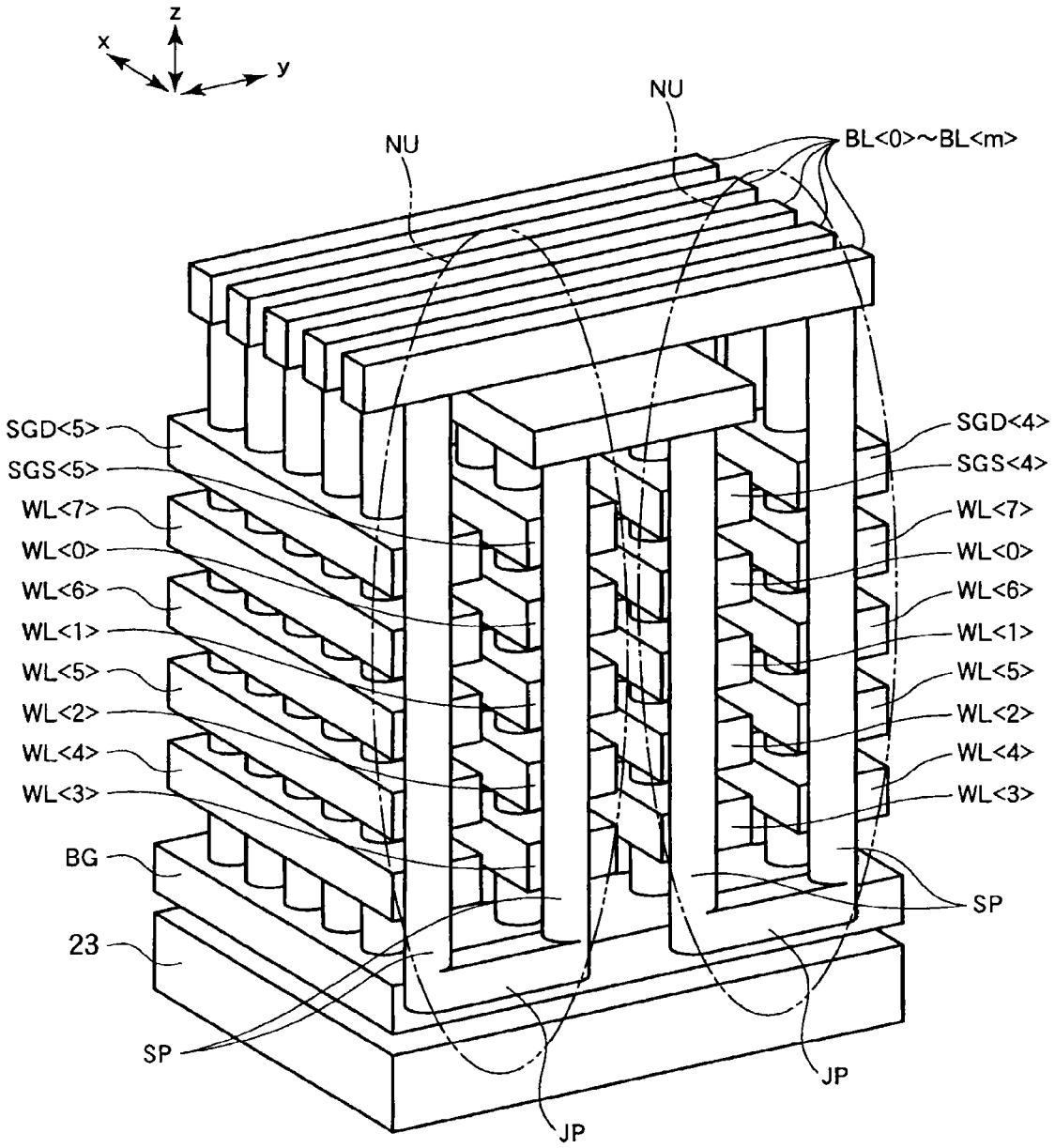
FIG. 20 is a diagram for explaining the application of the embodiment of the present invention.
Figure 21:
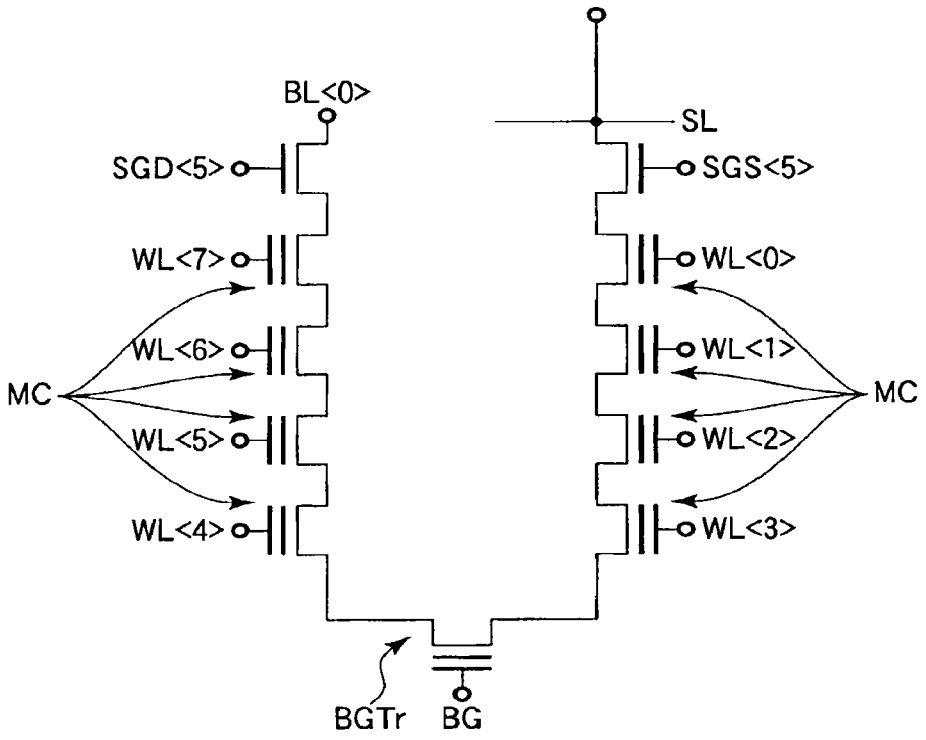
FIG. 21 is a diagram for explaining the application of the embodiment of the present invention.

For example, the embodiment of the present invention can also be applied to a BiCS-NAND flash memory shown in FIGS. 19 to 21. It should be noted that the same symbols are assigned in FIGS. 19 to 21 to members substantially similar in function to the members shown in FIGS. 1 to 4.

FIG. 19 shows a bird's-eye view of the BiCS-NAND flash memory different in configuration from the example shown in FIG. 1. FIG. 20 shows a bird's-eye view of an extraction of a block (memory cell array). Further, FIG. 21 shows an equivalent circuit diagram of one NAND cell unit provided in the block.

In the BiCS-NAND flash memory of the configuration shown in FIGS. 19 and 20 as well, three or more conductive layers made of, for example, conductive polysilicon are stacked (in this example, a six-layer structure). Further, a plurality of active layers (active areas) UAA extend through the plurality of stacked conductive layers. Moreover, a memory cell is formed at the intersection of the active layer and the conductive layer. While the lowermost one of the stacked conductive layers is plate-shaped in the BiCS-NAND flash memory shown in FIGS. 19 and 20, the other conductive layers except for the lowermost conductive layer are linearly shaped. In addition, as shown in FIG. 19, the ends of the stacked conductive layers in the x-direction are stepped to allow contact with each of these layers as in the example shown in FIG. 1.

In the BiCS-NAND flash memory shown in FIGS. 19 and 20, the plurality of active layers UAA are U-shaped when viewed from, for example, the x-direction. As shown in FIG. 20, the U-shaped active layer UAA is structured so that the lower ends of two semiconductor columns SP are connected together by a joint portion JP.

Accordingly, the source line SL is provided on the side of the semiconductor substrate 23 in the configuration shown in FIGS. 1 to 4. In contrast, in the configuration shown in FIGS. 19 to 20, a source line SL is provided in a layer higher than drain side select gate lines SGD<4>, SGD<5> which are provided on the upper end side of the active layers UAA. More specifically, in the BiCS memory shown in FIGS. 19 and 20, the source line SL is provided between a layer in which bit lines BL<0> to BL<m> are provided and a layer in which the drain side select gate lines SGD<4>, SGD<5> are provided. The source line SL extends in the x-direction, and is connected to one of the two semiconductor columns SP constituting one U-shaped active layer UAA. Further, one source line SL is shared by two NAND cell units NU adjacent in the y-direction.

Source line side select gate lines SGS<4>, SGS<5> are provided, for example, in the same layer as the bit line side select gate lines SGD<4>, SGD<5>, and are linear (straight) conductive interconnections extending in the x-direction.

In the example shown in FIGS. 19 and 20, word lines WL<0> to WL<7> are linear (straight) conductive interconnections extending in the x-direction.

Thus, in the BiCS-NAND flash memory shown in FIGS. 19 and 20, one NAND cell unit NU includes two semiconductor columns SP, so that the number of memory cells in one NAND cell unit is large (eight in this example) as shown in FIG. 21. In addition, four memory cells MC are provided in one semiconductor column SP.

As in the example shown in FIGS. 20 and 21, the joint portion JP may be connected to a back gate line BG via a back gate transistor BGTr. A conductive layer serving as the back gate line BG is located in a layer lower than a conductive layer serving as the word line, and the plane shape of the back gate line BG is in the shape of, for example, a plate two-dimensionally expanding on the semiconductor substrate 23. The back gate transistor BGTr is provided at the intersection of the joint portion JP and the plate-shaped back gate line BG. The joint portion JP serves as the channel area of the back gate transistor BGTr. The back gate transistor BGTr has, for example, the same structure as the memory cell MC. In addition, in the case of the configuration provided with the back gate line BG as in this example, the joint portion JP is not electrically connected to the semiconductor substrate 23.

Thus, the BiCS-NAND flash memory shown in FIGS. 19 to 21 also has the configuration in which the memory cells are three-dimensionally stacked, so that there are variations in element characteristics between the memory cell on the side of the select gate lines SGD<5>, SGS<5> and the memory cell on the side of the semiconductor substrate 23 (back gate line BG).

In the BiCS-NAND flash memory shown in FIGS. 19 to 21, the circuit configuration and coordination method described in the first to third adjustment examples of the embodiment of the present invention can be used to compensate for the variations in element characteristics.

In addition, in the BiCS-NAND flash memory shown in FIGS. 19 to 21, the diameters of the active layers UAA show about the same tendency (dimension) in the word lines which are provided in the same memory cell unit and which are located at the same position (height from the semiconductor substrate 23) in the z-direction, for example, the word line WL<3> and the word line WL<4>. In this case, the same common switch circuit may be used for the word line WL<3> and the word line WL<4> out of switch circuits 36A0 to 36A3 in a row decoder circuit 36A. Similarly, potentials supplied to the word lines WL<3>, WL<4> can be adjusted using about the same value, so that the same register in the register circuit 33 may be shared between the word line WL<3> and the word line WL<4>.

It goes without saying that, similarly to the two word lines WL<3>, WL<4>, the switch circuit and the register can be shared between the word line WL<2> and the word line WL<5>, between the word line WL<1> and the word line WL<6> and between the word line WL<0> and the word line WL<7> as long as the two word lines are located at the same position in the z-direction.

Thus, the embodiment of the present invention can be applied to the BiCS memory shown in FIGS. 19 to 21. Moreover, as shown in FIGS. 19 to 21, even if the number of memory cells (the number of word lines) constituting one NAND cell unit is increased, the switch circuit and the register are shared by the word lines having the same characteristic tendency, so that an increase in circuit scale can be inhibited.

However, it goes without saying that the number of registers provided in the register circuit 33 or the number of switch circuits in the row decoder circuit 36A, for example, may be changed in accordance with the number (e.g., eight) of word lines in the BiCS-NAND flash memory shown in FIGS. 19 to 21.

The embodiment of the present invention is not only applicable to the BiCS-NAND flash memories shown in FIGS. 1 to 19 but also to a three-dimensionally stacked nonvolatile semiconductor memory to which the BiCS technique is applied.

Furthermore, as the memory cell structure of the BiCS memory, a MONOS type or MNOS type structure in which a charge storage layer is made of an insulator (e.g., nitride) is considered effective. However, the present invention is not limited to this example and can also be applied to a floating gate type structure in which a charge storage layer is made of conductive polysilicon.

Moreover, a data value stored in one memory cell may be binary or multi-level equal to or more than ternary.

4. Alternatives

The trimming processing for the write potential has been mainly described in the embodiment of the present invention. However, a similar configuration and method can be employed to various potentials provided to the word line, such as a supply potential for a selected word line during reading operation, a supply potential for a nonselected word line during writing or reading operation, or a supply potential for a word line during erasing operation.

In the embodiment of the present invention, processing in the test step during the manufacture of a memory chip has been described by way of example. However, in a user service environment, the optimum value of the write voltage may change due to the deterioration of writing characteristics associated with the deterioration of memory cells. Accordingly, the present embodiment can also be applied to such a case where a potential suitably supplied to each of the word lines is reset.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

[1. A three-dimensionally stacked nonvolatile semiconductor memory comprising:

a memory cell array provided in a semiconductor substrate;

conductive layers stacked above the semiconductor substrate in the memory cell array in such a manner as to be insulated from one another;

a bit line which is disposed above the conductive layers in such a manner as to be insulated from the conductive layers;

a semiconductor column which extends through the conductive layers and which has an upper end connected to the bit line and a lower end connected to the semiconductor substrate;

word lines for which the conductive layers except for the uppermost and lowermost conductive layers are used;

memory cells provided at intersections of word lines and the semiconductor column, respectively;

a register circuit which retains operation setting information for the memory cell array and which has information to supply a potential suitable for each of the word lines; and a potential control circuit which controls the potentials supplied to the word lines and which reads the information retained in the register circuit in accordance with a position of a word line in a direction perpendicular to the surface of the semiconductor substrate and which supplies a potential suitable for the word line corresponding to an input address signal.]

[2. The three-dimensionally stacked nonvolatile semiconductor memory according to claim 1, wherein the register circuit has registers which retain potential codes indicating the potentials suitable for the word lines, respectively, and the potential control circuit selects the potential code corresponding to the input address signal from registers, and supplies the suitable potential to the word line corresponding to the input address signal in accordance with the selected potential code.]

[3. The three-dimensionally stacked nonvolatile semiconductor memory according to claim 1, wherein the register circuit has a first register which retains, as a reference code, a value indicating the potential suitable for one of the word lines, and one or more second registers which are respectively provided to correspond to the remaining word lines except for the one word line corresponding to the reference code and which retain a difference code between the reference code and a value indicating the potential suitable for each of the remaining word lines; and the potential control circuit selects the difference code corresponding to the input address signal from the one or more second registers, and supplies the suitable potential to a word line corresponding to the input address signal in accordance with a calculation result obtained from the selected difference code and the reference code.]

[4. The three-dimensionally stacked nonvolatile semiconductor memory according to claim 1, wherein the register circuit has first and second registers which retain first and second coefficients of an approximation function, respectively, and the potential control circuit uses the input address signal as a variable of the approximation function, and supplies the suitable potential to the word line corresponding to the input address signal in accordance with the approximation function using the first and second coefficients.]

[5. The three-dimensionally stacked nonvolatile semiconductor memory according to claim 1, further comprising:

an external device which externally controls the operation of the memory cell array, wherein the potential suitable for each of the word lines is set by an instruction from the external device.]

[6. The three-dimensionally stacked nonvolatile semiconductor memory according to claim 1, wherein the potential control circuit has an arithmetic unit which outputs a value indicating the potential supplied to the one word line in accordance with an output of the register circuit and the address signal, a converter which outputs a converted value of the value indicating the potential supplied to the one word line, a comparator which outputs a comparison value between a reference value and the converted value, and a potential generator which generates a potential suitable for each of the word lines in accordance with the comparison value.]

[7. The three-dimensionally stacked nonvolatile semiconductor memory according to claim 1, wherein the uppermost conductive layer is a straight first select gate line extending in a second direction intersecting with a first direction, and the lowermost conductive layer is a plate-like second select gate line.]

[8. The three-dimensionally stacked nonvolatile semiconductor memory according to claim 1, wherein the potential supplied to upper one of word lines is equal to or more than the potential supplied to lower one of the word lines.]

[9. The three-dimensionally stacked nonvolatile semiconductor memory according to claim 1, wherein the memory cell has an insulating film functioning as a charge storage layer.]

[10. The three-dimensionally stacked nonvolatile semiconductor memory according to claim 3, wherein the number of bits indicating the difference value in each of the second registor is smaller than the number of bits indicating the reference value in the first registor.]

[11. The three-dimensionally stacked nonvolatile semiconductor memory according to claim 3, wherein the difference code using writing operation differs from the difference code using reading operation.]

[12. The three-dimensionally stacked nonvolatile semiconductor memory according to claim 1, wherein at least one of the operation setting information and the information to supply a potential suitable for each of the word lines includes adjusted values in each of the word lines to supply the potential suitable for the word line, and the adjusted values are determined based on arithmetic processing for driving results of each of the word lines.]

*13. A semiconductor memory comprising:*

*a semiconductor substrate;*

*a stacked body disposed above the substrate, the stacked body including:*

*a first conductive layer disposed above the semiconductor substrate and configured as a first word line,*

*a second conductive layer disposed above the first conductive layer and configured as a second word line,*

*a third conductive layer disposed above the second conductive layer and configured as a third word line, and*

*a semiconductor column formed in a hole which penetrates the first conductive layer, the second conductive layer, and the third conductive layer in the stacked body, and extends in a first direction perpendicular to the semiconductor substrate;*

*a first storage portion which surrounds the semiconductor column, is disposed between the first conductive layer and the semiconductor column, and is configured as a first memory cell, a gate of the first memory cell being electrically connected to the first word line, wherein the first word line, the first storage portion, and a portion of the semiconductor column surrounded by the first storage portion are disposed along a second direction parallel to the semiconductor substrate;*

*a second storage portion which surrounds the semiconductor column, is disposed between the second conductive layer and the semiconductor column, and is configured as a second memory cell, a gate of the second memory cell being electrically connected to the second word line, wherein the second word line, the second storage portion, and a portion of the semiconductor column surrounded by the second storage portion are disposed along the second direction;*

*a third storage portion which surrounds the semiconductor column, is disposed between the third conductive layer and the semiconductor column, and is configured as a third memory cell, a gate of the third memory cell being electrically connected to the third word line, wherein the third word line, the third storage portion, and a portion of the semiconductor column surrounded by the third storage portion are disposed along the second direction, and wherein the first memory cell, the second memory cell, and the third memory cell are connected in series and configured as a memory string; and*

*a control circuit configured to perform a read operation on a condition that a first read voltage for reading first level data is applied to the first word line when the first word line is selected, a second read voltage for reading the first level data is applied to the second word line when the second word line is selected, or a third read voltage for reading the first level data is applied to the third word line when the third line is selected,*

*wherein the third read voltage is larger than the second read voltage, and second voltage is larger than the first read voltage, and*

*wherein a third diameter of the semiconductor column surrounded by the third storage portion in the second direction is larger than a second diameter of the semiconductor column surrounded by the second storage portion in the second direction, and the second diameter of the semiconductor column is larger than a first diameter of the semiconductor column surrounded by the first storage portion in the second direction.*

*14. The semiconductor memory according to claim 13, wherein*

*the control circuit is configured to perform the read operation on a condition that:*

*a first un-selection voltage is applied to the first word line when the second word line is selected,*

*a second un-selection voltage is applied to the second word line when the first word line is selected, the first un-selection voltage being different from the second un-selection voltage, and*

*a third un-selection voltage different from the first and second un-selection voltages is applied to the third word line when either of the first and second word lines is selected.*

*15. The semiconductor memory according to claim 14, wherein*

*the first un-selection voltage is lower than the second and third un-selection voltages.*

*16. The semiconductor memory according to claim 13, wherein the control circuit is configured to perform the read operation on a condition that:*

*a first un-selection voltage is applied to the first word line when the second word line is selected,*

*a second un-selection voltage is applied to the second word line when the first word line is selected, the first un-selected voltage being different from the second un-selection voltage, and*

*a third un-selection voltage different from the first and second un-selection voltages is applied to the third word line when either of the first and second word lines is selected.*

*17. The semiconductor memory according to claim 16, wherein*

*the first un-selection voltage is lower than the second and third un-selection voltages.*

*18. The semiconductor memory according to claim 13, wherein*

*the control circuit is configured to a perform a program operation on a condition that:*

*a first program voltage is applied to the first word line when the first word line is selected,*

*a second program voltage is applied to the second word line when the second word line is selected, the first program voltage being different from the second program voltage, and*

*a third program voltage different from the first and second program voltages is applied to the third word line when the third word line is selected.*

*19. The semiconductor memory according to claim 18, wherein*

*the control circuit is configured to perform the program operation on a condition that:*

*a first pass voltage is applied to the first word line when the second word line is selected,*

*a second pass voltage is applied to the second word line when the first word line is selected, the first pass voltage being different from the second pass voltage, and*

*a third pass voltage different from the first and second pass voltages is applied to the third word line when either of the first and second word lines is selected.*

*20. The semiconductor memory according to claim 13, wherein the control circuit is configured to perform a program operation on a condition that:*

*a first program voltage is applied to the first word line when the first word line is selected,*

*a second program voltage is applied to the second word line when the second word line is selected, the first program voltage being different from the second program voltage, and*

*a third program voltage different from the first and second program voltages is applied to the third word line when the third word line is selected.*

*21. The semiconductor memory according to claim 20, wherein*

*the control circuit is configured to perform the program operation on a condition that:*

*a first pass voltage is applied to the first word line when the second word line is selected,*

*a second pass voltage is applied to the second word line when the first word line is selected, the first pass voltage being different from the second pass voltage, and*

*a third pass voltage different from the first and second pass voltages is applied to the third word line when either of the first and second word lines is selected.*

* * * * *